United States Patent
Steffanson

(10) Patent No.: US 9,857,229 B1
(45) Date of Patent: Jan. 2, 2018

(54) FABRICATION METHOD FOR MICROMECHANICAL SENSORS

(71) Applicant: MP High Tech Solutions Pty Ltd, Eveleigh, NSW (AU)

(72) Inventor: Marek Steffanson, Mosman (AU)

(73) Assignee: MP High Tech Solutions Pty Ltd, Eveleigh (AT)

( * ) Notice: Subject to any disclaimer, the term of this patent is extended or adjusted under 35 U.S.C. 154(b) by 0 days.

(21) Appl. No.: 15/188,116

(22) Filed: Jun. 21, 2016

Related U.S. Application Data

(60) Provisional application No. 62/184,098, filed on Jun. 24, 2015.

(51) Int. Cl.
| | | |
|---|---|---|
| *H01L 21/00* | (2006.01) | |
| *G01J 5/10* | (2006.01) | |
| *B81C 1/00* | (2006.01) | |

(52) U.S. Cl.
CPC .............. *G01J 5/10* (2013.01); *B81C 1/0019* (2013.01); *B81C 2201/0132* (2013.01)

(58) Field of Classification Search
CPC .................................................. H01L 31/1804
See application file for complete search history.

(56) References Cited

U.S. PATENT DOCUMENTS

| | | | |
|---|---|---|---|
| 3,896,309 A | 7/1975 | Halsor et al. | |
| 5,929,440 A | 7/1999 | Fisher | |
| 6,031,619 A | 2/2000 | Wilkens et al. | |
| 6,208,413 B1 | 3/2001 | Diehl et al. | |
| 6,339,219 B1 | 1/2002 | Ishizuya et al. | |
| 6,444,972 B1 | 9/2002 | Datskos et al. | |
| 6,835,932 B2 | 12/2004 | Ishizuya et al. | |
| 7,064,883 B2 | 6/2006 | Payne et al. | |
| 7,646,494 B2 | 1/2010 | Lechuga Gomez et al. | |
| 7,705,307 B1 | 4/2010 | Zhao et al. | |
| 7,705,309 B1 | 4/2010 | Jin et al. | |
| 7,825,381 B2 | 11/2010 | Erdtmann et al. | |
| 8,242,446 B2 | 8/2012 | Fleury-Frenette et al. | |
| 8,283,256 B1 * | 10/2012 | Pan ..................... B81C 1/00603 257/E21.023 |
| 8,440,972 B2 | 5/2013 | Streuber et al. | |
| 8,624,187 B2 | 1/2014 | Urey et al. | |

(Continued)

FOREIGN PATENT DOCUMENTS

| | | |
|---|---|---|
| EP | 1692550 | 2/2012 |

OTHER PUBLICATIONS

Title: Apparatus and Method for Electromagnetic Radiation Sensing, U.S. Appl. No. 14/750,403, filed Jun. 25, 2015, Inventor(s): Marek Steffanson, et al, Status: Docketed New Case—Ready for Examination Status Date: Oct. 28, 2016.

(Continued)

*Primary Examiner* — Caleb Henry
*Assistant Examiner* — Mounir Amer
(74) *Attorney, Agent, or Firm* — Greenberg Traurig, LLP

(57) ABSTRACT

A method of fabricating electromagnetic radiation detection devices including: forming a first mask on a substrate; forming a structural layer on the substrate using the first mask; forming a metallic layer overlying the structural layer; removing the first mask; forming a second mask on the substrate, the second mask comprising mask openings; selectively patterning the metallic layer using the mask openings; and removing the second mask.

13 Claims, 20 Drawing Sheets

(56) References Cited

U.S. PATENT DOCUMENTS

| | | |
|---|---|---|
| 2002/0036265 A1 | 3/2002 | Ishizuya et al. |
| 2006/0075803 A1 | 4/2006 | Boisen et al. |
| 2006/0131500 A1 | 6/2006 | Dalakos et al. |
| 2007/0196944 A1 | 8/2007 | Chou et al. |
| 2007/0296838 A1 | 12/2007 | Erdtmann |
| 2008/0230698 A1 | 9/2008 | Simelgor et al. |
| 2009/0001271 A1 | 1/2009 | Erdtmann et al. |
| 2009/0238236 A1 | 9/2009 | Fleury-Frenette et al. |
| 2010/0148283 A1* | 6/2010 | Shih .................. B81C 1/00246 257/415 |
| 2011/0127073 A1* | 6/2011 | Ryu .................... H05K 3/4608 174/257 |
| 2011/0159638 A1* | 6/2011 | Wang ..................... H01L 21/56 438/108 |
| 2011/0279681 A1 | 11/2011 | Cabib et al. |
| 2011/0291225 A1* | 12/2011 | Klatt ................ H01L 21/76816 257/506 |
| 2012/0032082 A1 | 2/2012 | Pradere et al. |
| 2015/0061020 A1* | 3/2015 | Yokoyama .......... H01L 27/0694 257/347 |
| 2015/0377711 A1 | 12/2015 | Steffanson et al. |

OTHER PUBLICATIONS

Title: Micromechanical Device for Electromagnetic Radiation Sensing, U.S. Appl. No. 14/788,286, filed Jun. 30, 2015, Inventor(s): Marek Steffanson, Status: Non Final Action dated Feb. 29, 2016.

Title: Micromechanical Device for Electromagnetic Radiation Sensing, U.S. Appl. No. 14/810,363, filed Jul. 27, 2015, Inventor(s): Marek Steffanson, Status: Non Final Action dated Jul. 12, 2016.

Cheng et al. "Optical readout sensitivity of deformed microreflector for uncooled infrared detector: theoretical model and experimental validation" Nov. 2009, J. Opt. Soc. Am. A, vol. 26, No. 11 p. 2353-2361.

Corbeil et al., "Self-leveling" uncooled microcantilever thermal detector, Applied Physics Letters, Aug. 12, 2002, vol. 81, No. 7, pp. 1306-1308.

Grbovic, Fabrication of Bi-material MEMS detector arrays for THz imaging, Proc. of SPIE vol. 7311 731108, 2009.

Grbovic, Imaging by Detection of Infrared Photons Using Arrays of Uncooled Micromechanical Detectors, May 2008.

Grbovic, Progress with MEMS Based UGS (IR/THz), Proc. of SPIE vol. 6963, 696317, (2008).

International Patent Application PCT/US15/37981, International Search Report and Written Opinion, dated Oct. 13, 2015.

Miao et al., Uncooled IR imaging using optomechanical detectors, ScienceDirect Ultramicroscopy 107 (2007), pp. 610-616.

Toy et al. "Uncooled infrared thermo-mechanical detector array: Design, fabrication and testing", Feb. 2009, Sensors and Actuators A: Physical, p. 88-94.

Wang et al., IR imaging using a cantilever-based focal plane array fabricated by deep reactive ion etching technique, Applied Physics Letters 91, 054109 (2007).

Yu et al. Design and fabrication of high sensitivity focal plane array for uncooled IR imaging, pub. Mar. 25, 2008, Journal of Micromechanics and Microengineering, p. 1-8.

\* cited by examiner

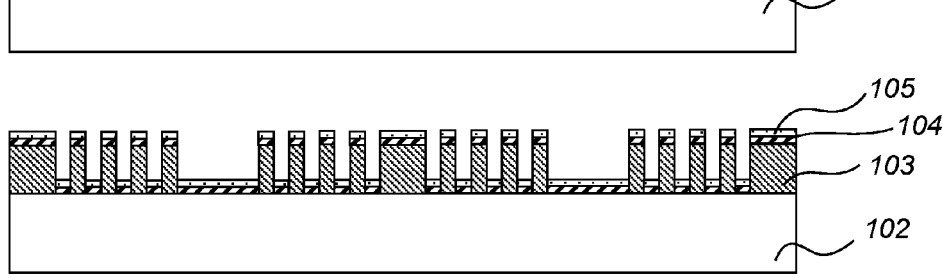
FIG. 6A
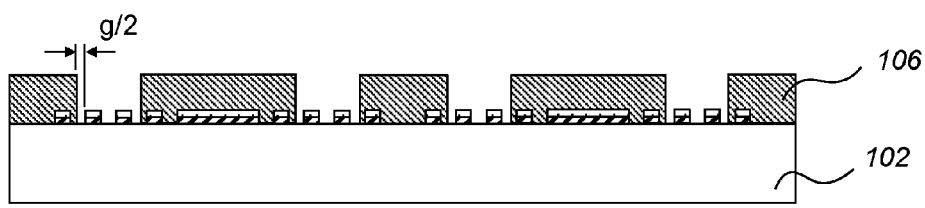
FIG. 6B
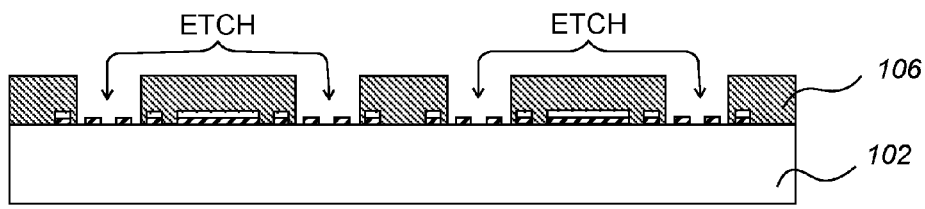
FIG. 6C
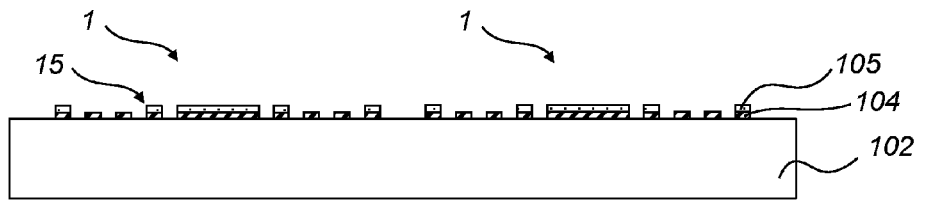
FIG. 6D
FIG. 6E

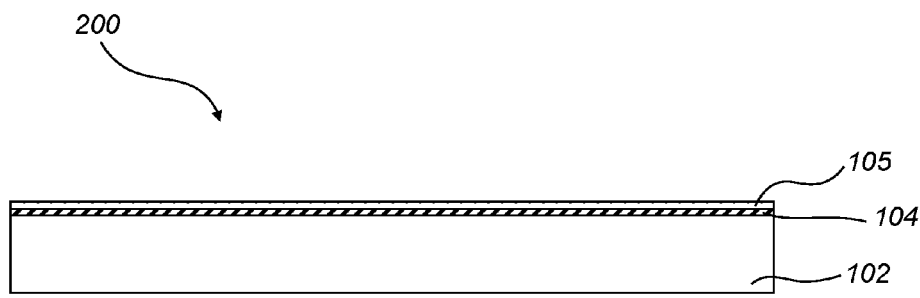
FIG. 8A
FIG. 8B
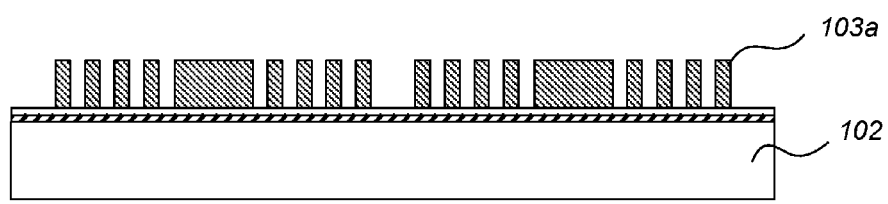
FIG. 8C
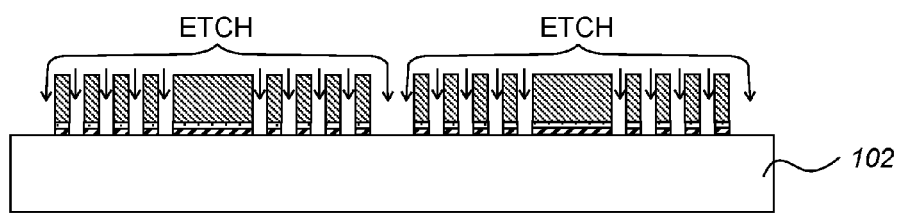
FIG. 8D
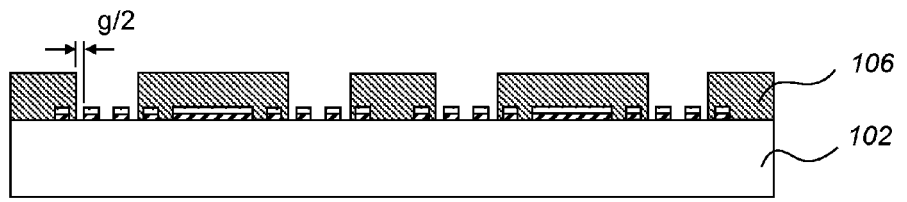
FIG. 8E
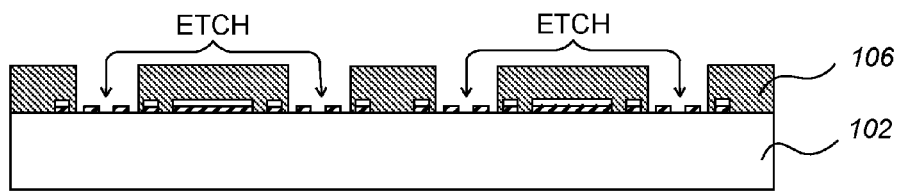
FIG. 8F

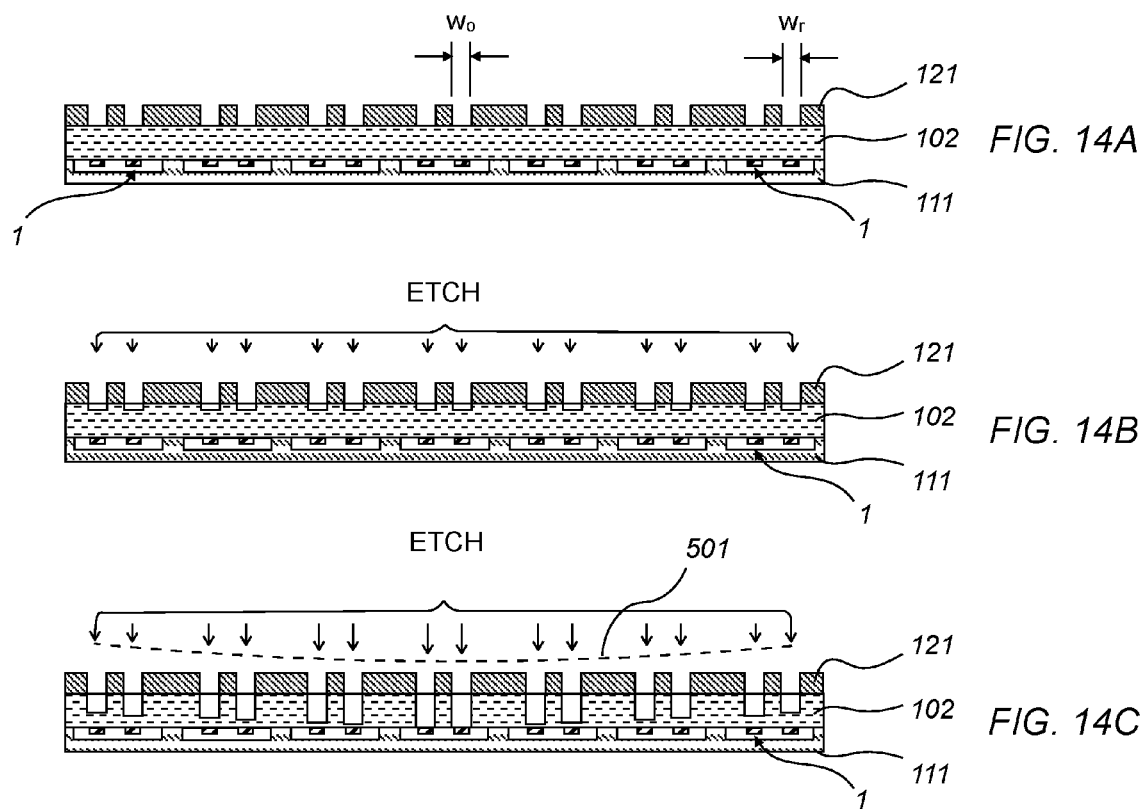

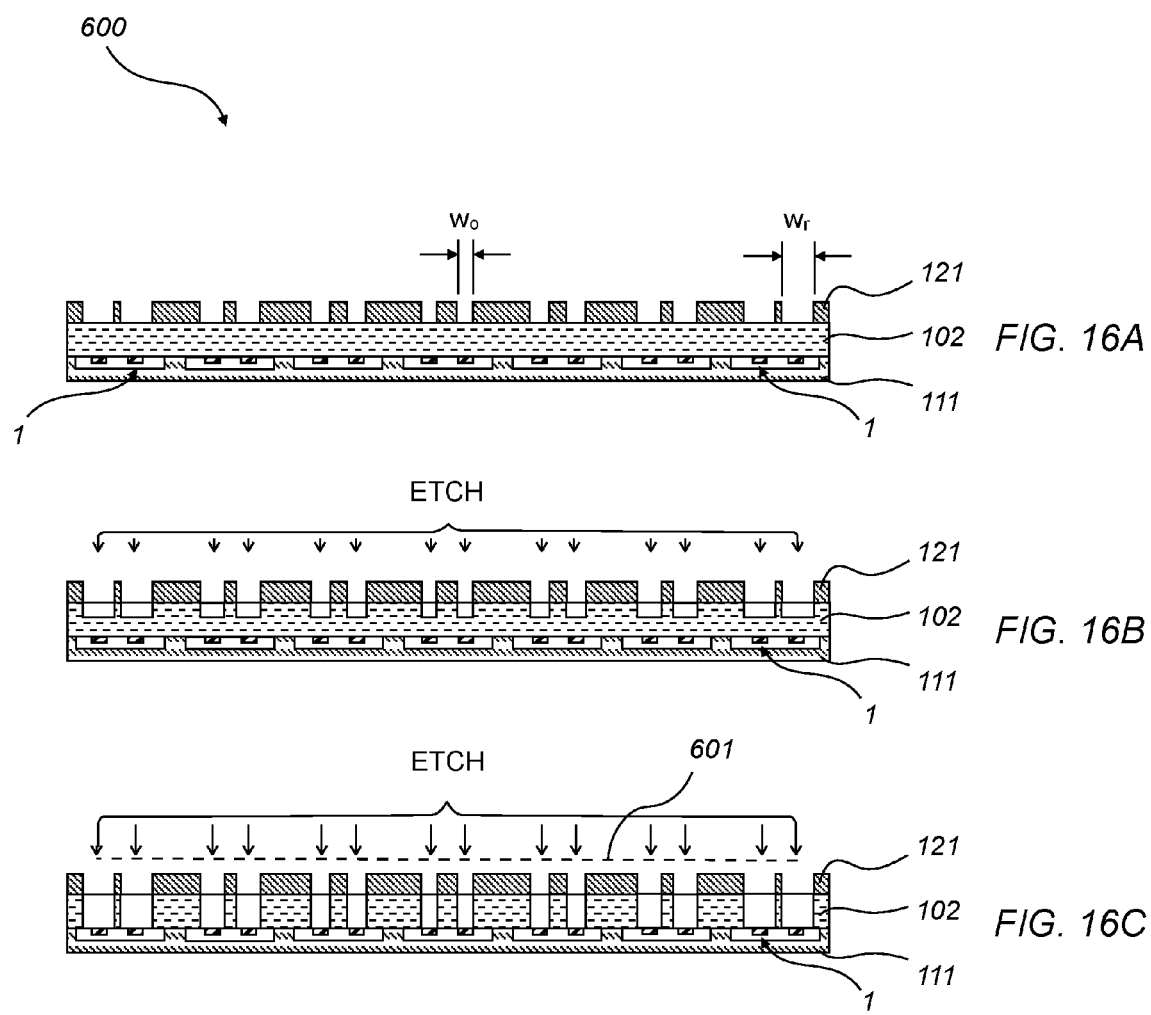

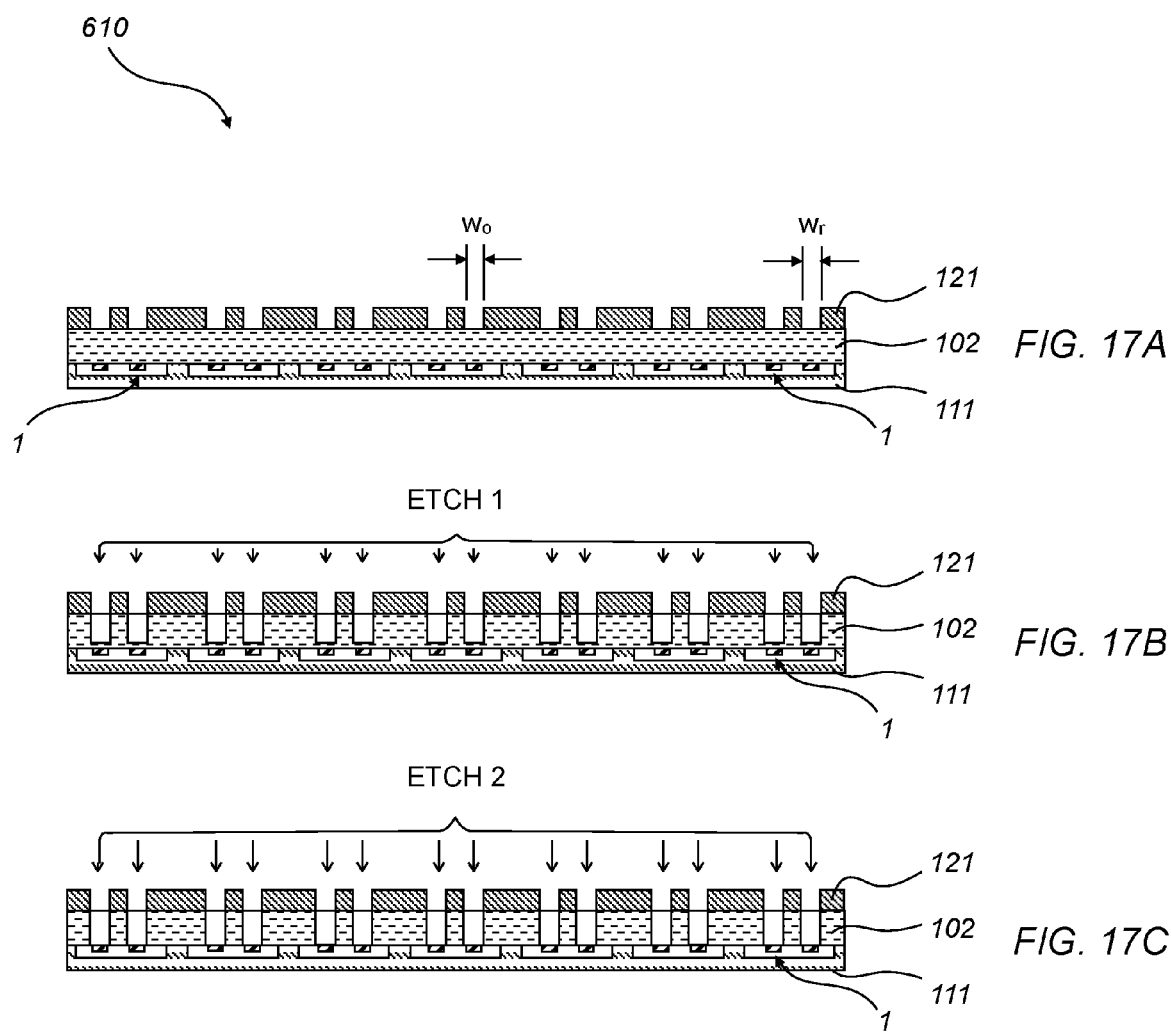

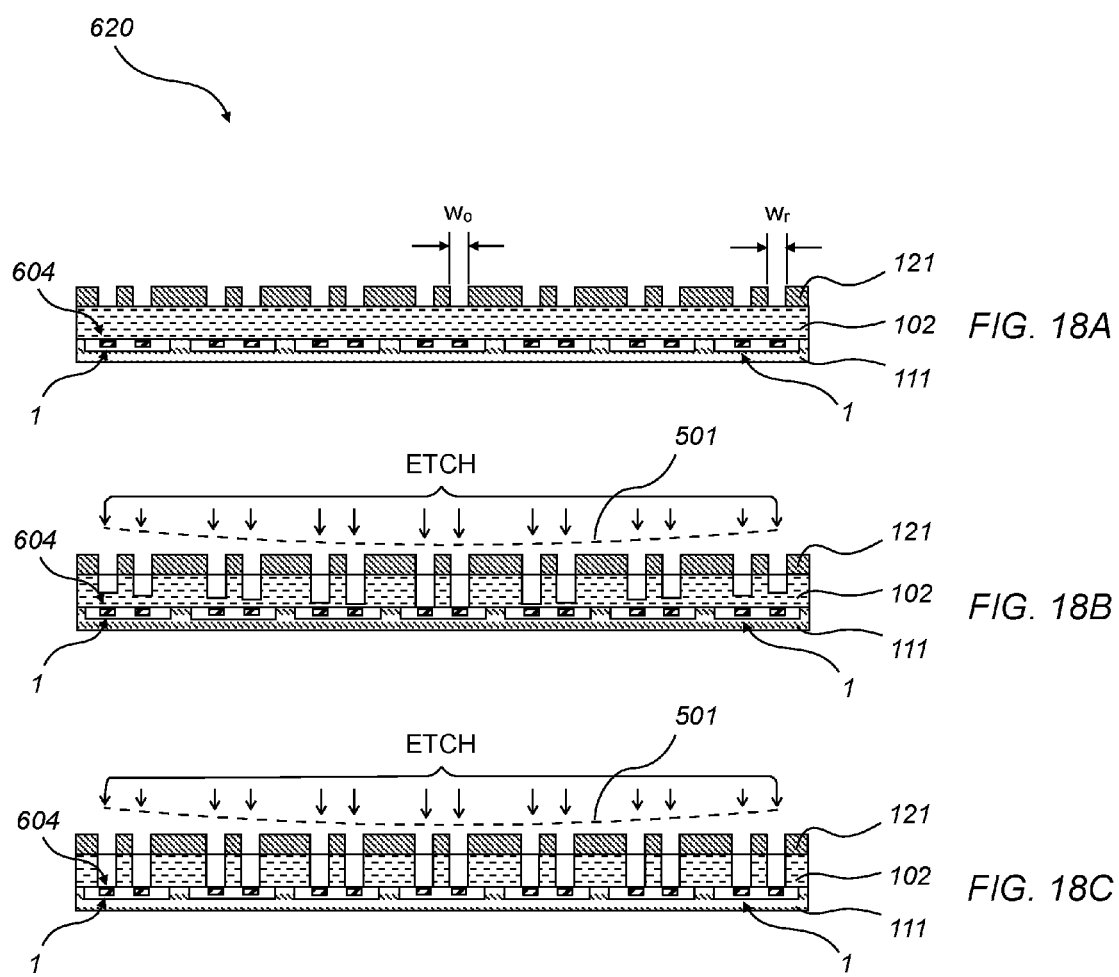

FIG. 19A
FIG. 19B
FIG. 19C
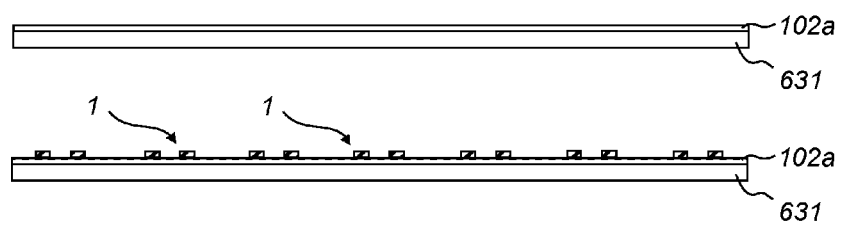
FIG. 19D
FIG. 19E
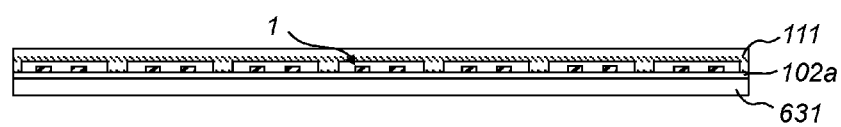
FIG. 19F
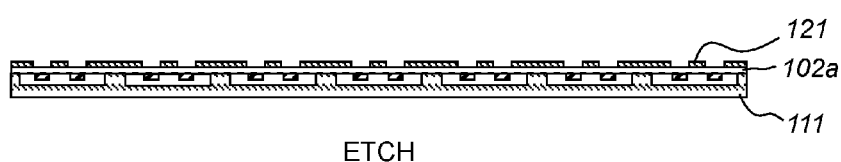
FIG. 19G
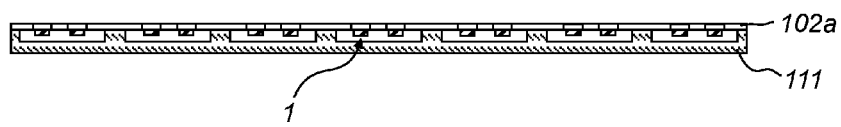
FIG. 19H

FABRICATION METHOD FOR MICROMECHANICAL SENSORS

CROSS-REFERENCE TO RELATED APPLICATIONS

The present application claims the benefit of and priority to U.S. Provisional Application Ser. No. 62/184,098, filed Jun. 24, 2015, entitled "Fabrication Method For Micromechanical Sensors," the entire content of which application is incorporated by reference as if fully set forth herein.

FIELD

This disclosure relates to the field of micromechanical devices (e.g., fabrication of electromagnetic radiation detection devices), and in particular, but not limited to, an un-cooled, micro-thermo-mechanical device operating in backside irradiation mode and frontside optical readout.

BACKGROUND

Micro- and nanotechnologies can be used to fabricate a radiation sensing device. Radiation sensing and in particular infrared radiation sensing can be utilized for nonvisual environment monitoring, remote thermal mapping, thermal imaging, human occupancy sensing, human gesture recognition and human activity monitoring.

Currently, some fabrication methods are known to fabricate micro-thermo-mechanical devices that operate through the bi-material effect (e.g., U.S. Pat. No. 3,896,309). The bi-material effect allows a mechanical reversible deformation of a free-standing structure upon temperature change. The physical phenomenon behind the displacement is a mismatch of coefficients of thermal expansion (CTEs) of the different materials forming the free-standing structure. Such effect is useful for instance for thermal radiation sensing where radiation energy is converted into a mechanical displacement of a microscopic geometry. To realize a bi-material structure, typically two materials are connected to each other, forming a compound in a long, thin, cantilever-like arrangement. For radiation-sensing applications, an array of bi-material actuated micro-devices is deployed, comprising thin-films that are deposited and structured on top of each other, and which are later released to form a free-standing structure.

Currently, some micro-thermo-mechanical devices are known that include a fabrication method which utilizes partial substrate removal and makes sacrificial layers redundant, in order to release the devices to have them free-standing and function accordingly (e.g., Z. Miao et al. in "Uncooled IR imaging using optomechanical detectors", in Ultramicroscopy 107 (2007) 610-616, or D. Grbovic et al. in "Arrays of SiO2 substrate-free micromechanical uncooled infrared and terahertz detectors", in JOURNAL OF APPLIED PHYSICS 104, 054508 (2008)).

Currently-known fabrication methods to produce micro-thermo-mechanical devices include the separate patterning of the first and a separate patterning of the second layer. For example the bottom layer is structured first with a first patterning mask and then the second layer is structured with a second patterning mask on top of the first already patterned layer. In such case the alignment of the second patterning mask is critical to the features from the first mask to realize an accurate overlay of the features. The overlay of the structuring patterns (photolithographic masks) can be bound to strict tolerances. Great effort needs to be put in the alignment procedure to achieve sufficiently precise overlay of the first layer on top of the second layer, or vice versa. Typically the structures have dimensions in the micrometer range—for example the critical bi-material region can be of 3 µm width and 100 µm length. In such example a misalignment of a few micrometers would lead to intolerable misalignment of the critical regions and therefore to complete discard of the microfabrication process at that stage.

BRIEF DESCRIPTION OF THE DRAWINGS

The embodiments are illustrated by way of example and not limitation in the figures of the accompanying drawings in which like references indicate similar elements.

FIGS. 6A to 6E disclose a schematic example process flow method of the frontside structuring including the "self-alignment" method in order to produce herein disclosed advanced micro-thermo-mechanical devices.

FIGS. 8A to 8F disclose another schematic example process flow method of the frontside structuring including the "self-alignment" method in order to produce herein disclosed advanced micro-thermo-mechanical devices.

FIGS. 14A to 14C show a schematic example process flow of the backside release including a disadvantageous non-uniform etch profile as can occur in some embodiments.

FIGS. 16A to 16C disclose a schematic example process flow method of an embodiment including a substantially uniform and a substantially simultaneous release of advanced micro-thermo-mechanical devices.

FIGS. 17A to 17C disclose a schematic example process flow method of another embodiment including a substantially uniform and a substantially simultaneous release of advanced micro-thermo-mechanical devices.

FIGS. 18A to 18C disclose a schematic example process flow method of another embodiment including a substantially uniform and a substantially simultaneous release of advanced micro-thermo-mechanical devices.

FIGS. 19A to 19H disclose a schematic example process flow method of another embodiment including a substantially uniform and a substantially simultaneous release of advanced micro-thermo-mechanical devices.

DETAILED DESCRIPTION

Figure 1:
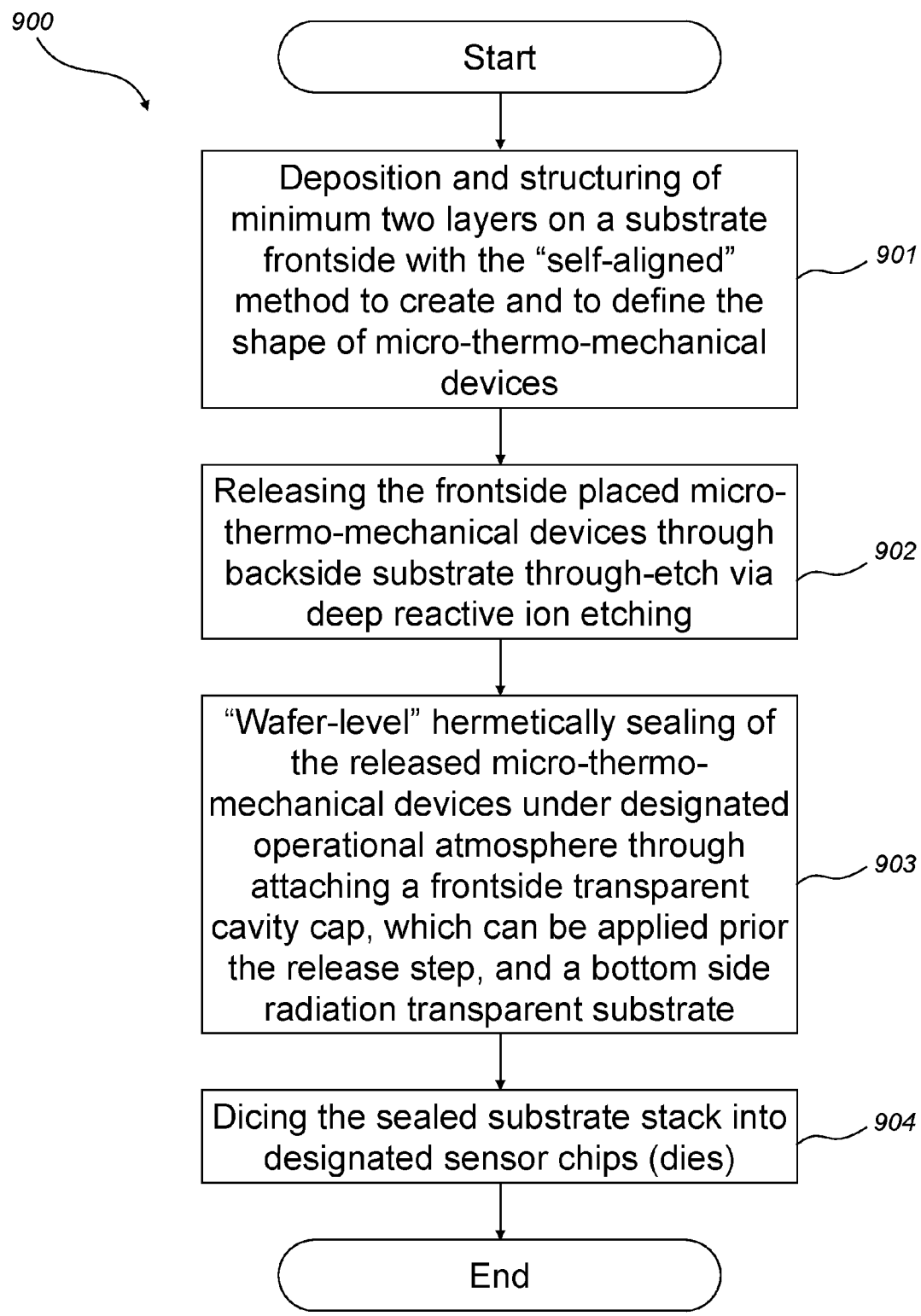
FIG. 1 shows an overview of main steps of the microfabrication process to produce advanced micro-thermo-mechanical devices.

Details of one or more embodiments of the subject matter described in this specification are set forth in the accompanying drawings and this description. Other features, aspects, and advantages will become apparent from the description, the drawings, and the claims. Note that the relative dimensions of the figures may not be drawn to scale.

The following description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

A need exists to simplify microfabrication methods to produce micro-thermo-mechanical devices. Although fabrication of so-called "advanced" devices is described for various embodiments below, the disclosure is not limited to this specific type of device. In alternative embodiments, other types of devices may be formed using the teachings of the disclosure. For example, some aspects of the disclosure may be useful for some devices that are not solely used for radiation sensing.

A backside substrate through-etch release process to release micro-thermo-mechanical devices can oppose a high level of non-uniformity due to spatial or temporal gradients of the etch agents during the dry-etch release process which is performed through deep reactive ion etching (DRIE). Relatively thick and large substrate through-etch processes utilizing the preferred method of DRIE may result in etch-duration-dependent, spatial etch-rate variations. Such non-uniformities can result in a low yield fabrication procedure of advanced micro-thermo-mechanical devices. Hence, a need exists to increase the yield of the micro-thermo-mechanical device fabrication process.

One advantage of a micro-thermo-mechanical device is the spatial separation of the readout mechanism. The device itself does not need any power supply and is passively functional and can reversibly deflect upon temperature changes. The radiation induced deflections can be optically read out without the readout system being in physical contact with the devices.

While various micro-thermo-mechanical devices have been disclosed to date, no encapsulating method has been disclosed to fully fabricate and package the devices on a large-scale substrate for mass manufacturing. An encapsulation, or packaging (hermetical sealing) can enhance the performance of a micro-thermo-mechanical device. An optically read micro-thermo-mechanically device does not require any wire connection or wire-bonding of the sensor chip in the final detector assembly, and hence has a better cost advantage over currently electronically-based radiation detectors. A need exists for improving packaging methods for micro-thermo-mechanical devices. The present disclosure also includes methods to integrate optical elements into the device encapsulation packaging.

As used herein, "advanced" refers to a bi-material radiation micro-sensor that is realized without the utilization of sacrificial layer technology. Further, herein a bi-material radiation micro-sensor is an exemplary type of "micro-thermo-mechanical" device, and this device operates after the thermo-mechanical principle utilizing the bi-material actuation at a microscopic scale. Further, such fabrication methods include the deposition of a dielectric thin film (e.g., silicon oxide) and a metallic thin film (e.g., aluminum) to form a bi-material compound. Further, such advanced devices include a symmetrical bi-material actuation arrangement, with two symmetrical bi-material regions enclosing a thermal isolation region. The thermal isolation region typically consists of a structure comprising only the dielectric layer.

Therefore, a minimum amount of two structuring steps are necessary to define the geometry of an advanced micro-thermo-mechanical device: 1) structuring one thin-film layer, and 2) structuring the second thin-film layer. Once both layers are structured, the top thin-film layer is covering only some regions of the surface of the structured bottom layer. The bottom layer is the structural layer and has the ability to absorb radiation, which falls on it from the backside. The top-layer is the metallic layer, which reflects optically visible light from the optical displacement detection readout, which is utilized to convert the micromechanical displacements of the devices into an electrical signal.

In various embodiments below, simplified fabrication methods to fabricate advanced micro-thermo-mechanical devices are disclosed that can be used for radiation sensing, in particular for infrared radiation sensing and operating in backside irradiation mode with frontside optical readout. The operational principle of such devices includes radiation absorption, whereupon the device experiences a temperature increase and leads to a micro-mechanical deflection, caused by the bi-material effect. The deflection can be proportional to the absorbed radiation intensity and the deflection is read out with an optical system and converted into an electrical signal.

Such advanced micro-thermo-mechanical device is fabricated through micromachining by utilizing a minimum of two layers. The first and bottom layer is a structural layer, which is a dielectric material such as, but not limited to silicon oxide. The second layer is a metallic layer, such as, but not limited to aluminum or gold. The second layer typically has a higher CTE than the first layer, and a compound of the two layers can induce the bi-material effect. The second layer defines the reflector area, the bi-material area and the thermal conduction area of the micromechanical device (one micromechanical device can be referred to as one pixel). The first layer defines the entire shape of the micromechanical pixel, supports the second layer and functions as a radiation absorber and a thermal insulator. The micromechanical device can contain further layers in addition to the two basic layers.

A first aspect of the present disclosure is the simplification of the front-side patterning process. In particular the structures are fabricated in a "self-aligned" patterning step, reducing the efforts for critical alignment.

A second aspect of the present disclosure is a protection method of the frontside features at the backside release with dry-etch. The protection method simplifies the overall fabrication method, by making deployments and the later removal of frontside protective layers redundant.

A third aspect of the present disclosure are methods to increase the uniformity of the backside etch-release process, which can lead to an increase of the overall fabrication yield.

A fourth aspect of the present disclosure is a method presented to encapsulate the advanced micro-thermo-mechanical devices in a hermetically-sealed environment.

A fifth aspect of the present disclosure is a method to integrate imaging elements into sensor chip packaging containing the advanced micro-thermo-mechanical devices.

Referring now to FIG. 1, the herein disclosed simplified microfabrication method 900 for fabricating advanced micro-thermo-mechanical devices can be described with four parts (sub-processes); First part 901: Frontside patterning of the two basic layers to form the shape of the micro-thermo-mechanical devices. Second part 902: backside substrate through-etch to release the devices. Third part 903: encapsulation of the devices preferably in an operational atmosphere for performance improvements. And fourth part 904: dicing the sealed substrate stack into individual sensor chip dies.

The first three sub-processes include features to simplify the fabrication, to increase yield of the overall fabrication process and to integrate further components into the fabrication process to simplify the detector setup and ultimately to save overall detector costs. The entire fabrication process does not utilize any sacrificial layers to create free-standing devices. A typical radiation-sensing detector embodiment includes an imaging lens, an optical readout system, a signal processing and transmission unit, and a sensor chip consisting of the individual micro-thermo-mechanical devices, which form a plane array for radiation imaging (which corresponds to a pixel array).

Figure 2:
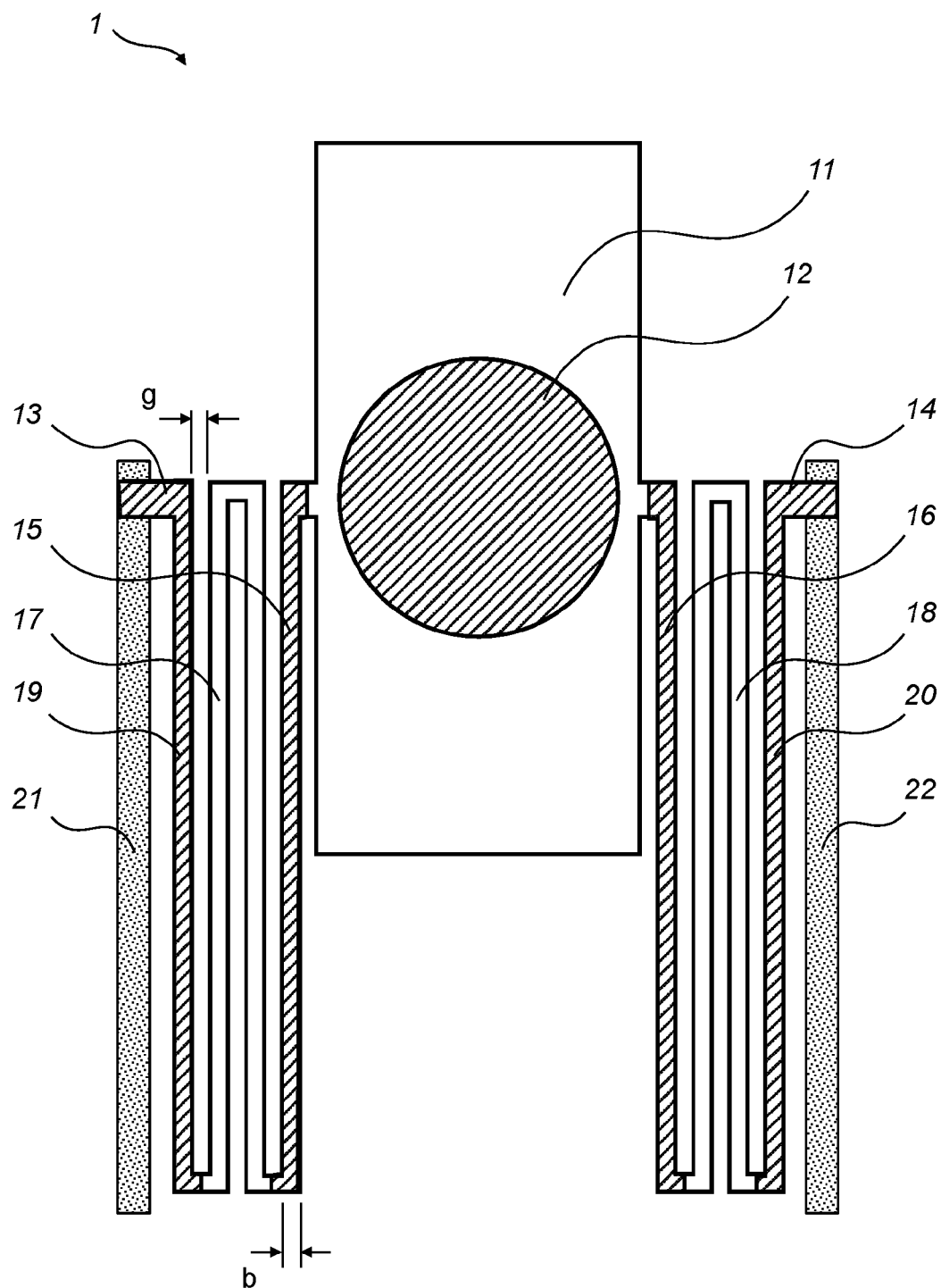
FIG. 2 shows an example outline of one advanced micro-thermo-mechanical device.

Referring now to FIG. 2, in one embodiment a schematic top-view example of an advanced micro-thermo-mechanical device 1 is disclosed. Such advanced micro-thermo-mechanical device 1 is realized in its simplest form from two different layers without utilizing sacrificial layers. The device 1 typically consists of an absorber area 11, a reflector area 12, which can in some embodiments cover the entire absorber area 11, and a symmetrical arrangement of sideways legs, consisting of at least one bi-material region 15 and 16, left and right of the absorber plate respectively. Further, the device 1 includes in this example embodiment thermal isolation regions 17 and 18, left and right of the inner bi-material regions respectively. The entire device is anchored with anchor elements 13 and 14 to the partial substrate 21 and 22 respectively. The legs and the absorber/reflector plate are released, hence free-standing. In this example embodiment the diagonally hatched regions, namely the reflector 12, both inner bi-material regions 15 and 16, outer bi-material regions 19 and 20, and anchor elements 13 and 14 represent the shape of the metallic layer on top of the structural layer. Hence, the second layer covers the bottom or structural layer only on specific regions. The most critical regions where the top layer needs to be attached on top of the bottom layer are the regions of the inner bi-material legs 15 and 16. The inner bi-material legs are inducing the thermo-mechanical actuation of the absorber/reflector.

The geometrical indications of dimension g represents the width of the gap between the single substantially parallel elements of the device 1 and the indication dimension b represents the width of the inner bi-material actuation region. An example of the widths g and b can be 3 µm; hence g=3 µm and b=3 µm.

Figure 3:
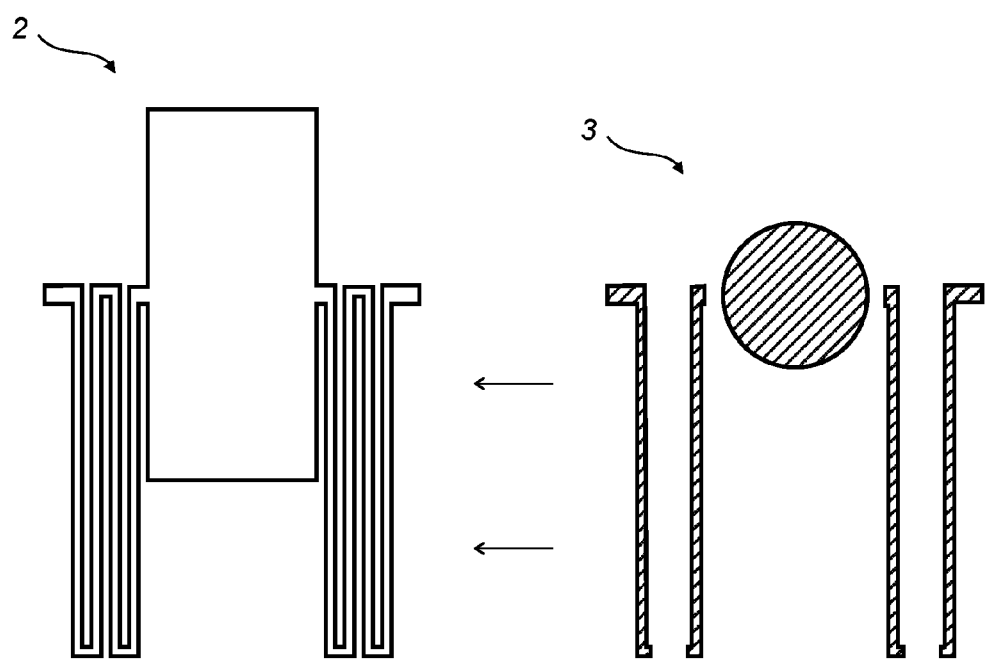
FIG. 3 shows a prior art example of the overlay of two layers in order to produce micro-thermo-mechanical devices.

Referring now to FIG. 3, a schematic prior-art top-view example is shown of two patterning mask outlines. The patterning mask 2 is to define the structural layer geometry and the patterning mask 3 is to define metallic layer shape. As shown in this example schematically, the illustrated approach is to first pattern each layer individually and then align and overlay both patterned layers on top of each other. The alignment of both patterning outlines needs to be extremely precise, within deviations of fractions of dimension b, to achieve a tolerable overlay of both layers at the critical actuating bi-material regions.

Figure 4:
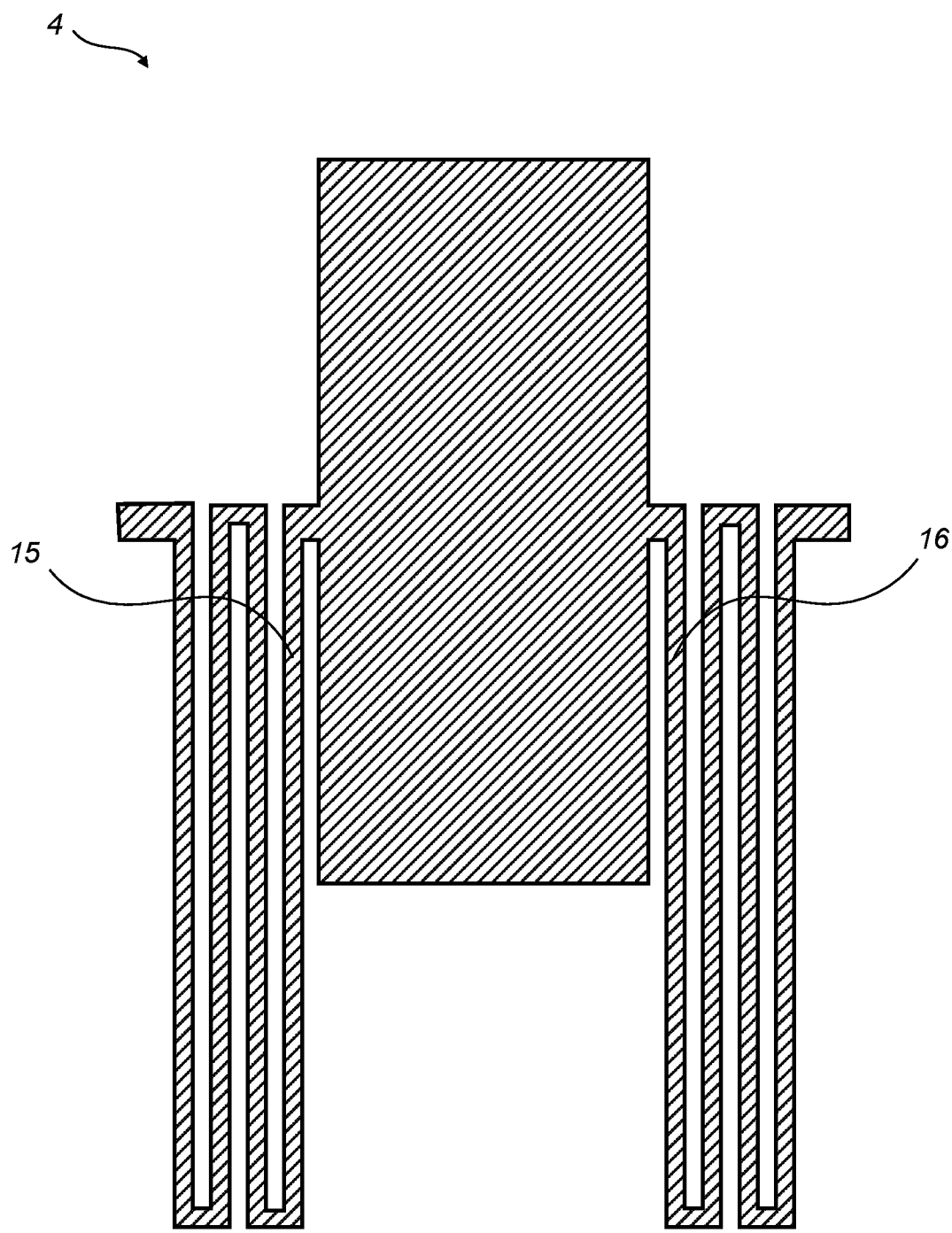
FIG. 4 shows an example outline of the first patterning mask in order to produce advanced micro-thermo-mechanical devices.

Referring now to FIG. 4, according to the present disclosure, a schematic top-view of first patterning mask outline 4 is shown. This top-view embodiment of the first patterning mask 4 is meant to define the shape of the structural layer. The first aspect of present disclosure is to also pattern the second layer with the first patterning mask 4. This method allows achieving an exact 1:1 overlay of the critical regions of the actuating bi-material regions 15 and 16. The process flow methods are described in more detailed examples below.

Figure 5:
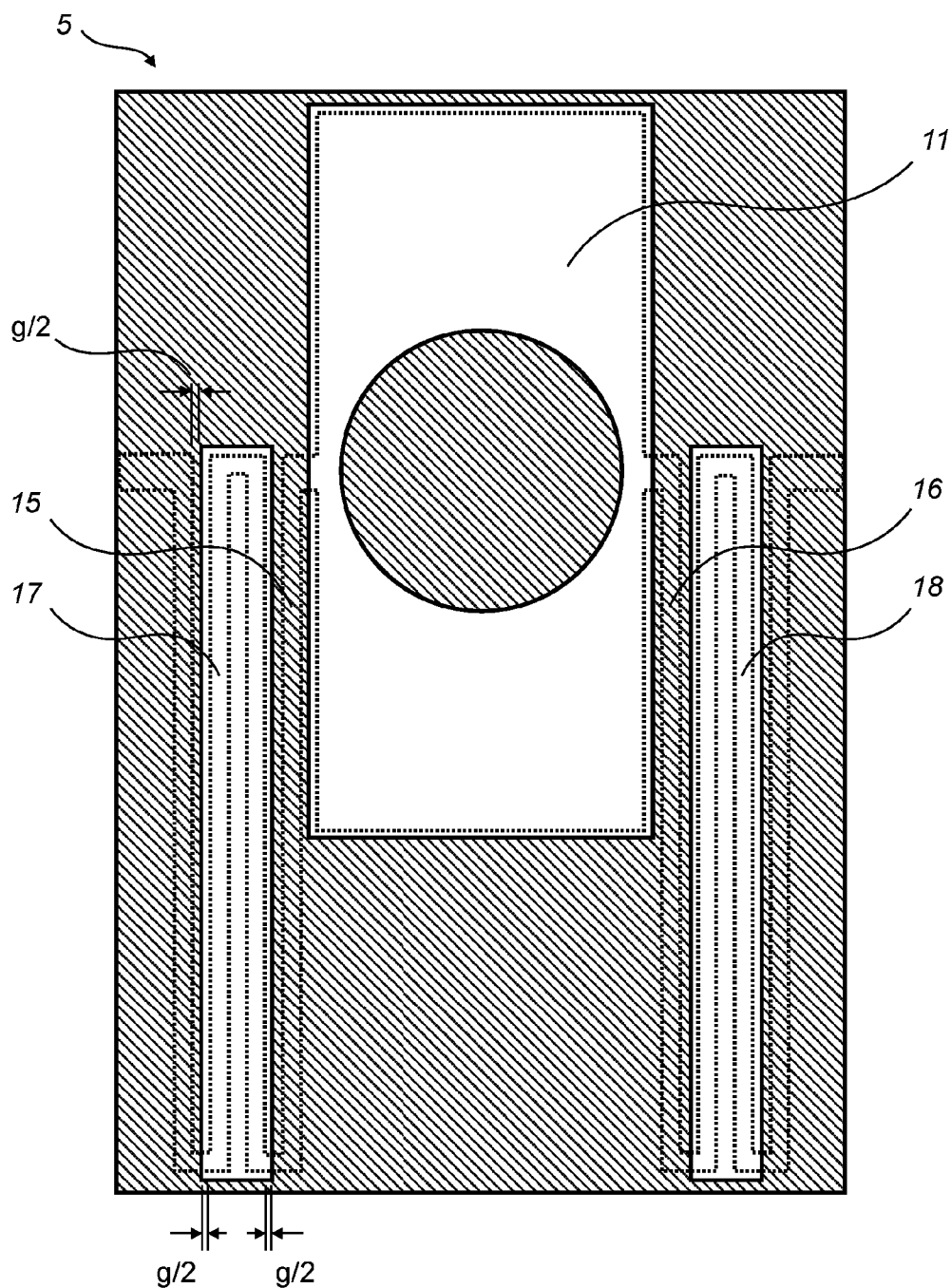
FIG. 5 shows an example outline of the second patterning mask and its alignment with respect to the first patterning mask in order to produce advanced micro-thermo-mechanical devices.

Referring now to FIG. 5, a schematic top-view of the second patterning mask outline 5 is shown. Beneath the mask 5 lies schematically indicated with dotted lines the patterned structure of both layers as defined by the mask 4 in the embodiment of FIG. 4. The diagonally hatched regions are the protective mask on top of the structural layer. The inner openings (non-hatched) define the regions where the second layer will be selectively removed (etched) and only the structural layer will remain. These regions (the openings) can be referred to as "etch-windows". In this embodiment the mask 5 is designed to have openings only at the region of isolation arms 17 and 18 and regions of the absorber plate 11. In this example the mask 5 openings at the thermal isolation regions include an extra width of about g/2, left and right of each isolation feature, as indicated schematically with the lower geometrical indications—the mask 5 is aligned with its long edges of the isolation arm etch windows to the center of the gaps g. This embodiment illustrates that if the mask 5 alignment on the patterned features that were defined with mask 4 would include a misalignment of about smaller than +/−(g/2), then the critical bi-material features 15 and 16 would remain unaffected by such misalignment. With such misalignment the device 1 would have still an exact 1:1 overlay of the critical bi-material region 15 and 16 and therefore could still function accordingly. This is just one example of the herein described "self alignment" method.

Referring now to FIGS. 6A to 6E, a schematic method of a microfabrication process flow 100 is disclosed. The process flow 100 is the first sub-process 901 of the entire fabrication process 900 to realize advanced micro-thermo-mechanical devices 1. The first sub-process includes the frontside patterning and defining the devices' geometry. The microfabrication process flow 100 is a method disclosing the "self-alignment" method as described herein. The microfabrication process flow 100 utilizes the lift-off technique to initially pattern both layers.

FIG. 6A is schematic cross sectional view of a substrate 102 (e.g., a semiconductor wafer) with a deployed first patterning mask 103. The patterning mask 103 is an inverse pattern to the mask 4 described in FIG. 4. This patterning mask can be implemented by utilizing a photolithographic resist. Typically, there are no or few conditions in aligning the patterning mask 103 relative to the substrate, unless an initial substrate patterning has been performed as a prior process step. The patterning mask 103 defines the shape of the structural layer.

FIG. 6B shows a schematic cross sectional view of a substrate 102 with an initial patterning mask 103 and a minimum two-layer deposition of layer 104 and layer 105 on top of the patterning mask 103. The layers 104 and 105 come in contact with the substrate 102 where the patterning mask 103 has designated openings. In this embodiment the layer 104 provides the structural layer and the layer 105 provides the metallic layer. In some embodiments both layers can be deposited in one reaction chamber in sequence in one process run. Utilizing a thin-film evaporation tool is one example.

In some embodiments more than two layers can be deposited on top of the substrate 102. For example an initial etch stop layer, or an absorption layer may be deposited prior to the structural layer deposition, in some cases even in the same evaporation process in one reaction chamber. In some embodiments an adhesion layer can be deployed prior to the metallic thin film deposition. In some embodiments the deposition process can be a uniform coverage of any horizontal and vertical surfaces, and the sidewalls of the patterning mask 103 may be covered with layer 104 and 105 as well. Typically, sidewall coverage can occur when thin-films are sputtered rather than evaporated onto the substrate.

After the thin-film depositions, the patterning mask 103 is removed from the substrate 102. The removing of the patterning mask 103 can be a standard microfabrication procedure called lift-off. The layers that came in contact with the substrate during their depositions typically adhere on the substrate as the patterning mask 103 is removed.

FIG. 6C shows a schematic cross-sectional view of a substrate 102 with a second patterning mask 106 on the patterned layers 104 and 105. Patterning mask 106 can be a schematic cross-section of the mask 5 in FIG. 5. Patterning mask 106 is used to remove certain metallic regions on top of the structural layer. Hence, the openings in the patterning mask 106 allow the etch agent to remove the metallic layer 105 in the designated areas (openings), as displayed schematically in FIG. 6D. The etch agent is selective, i.e. it should remove only the metallic layer and not the structural layer. Selective metallic layer removal is a standard microfabrication process and can be performed utilizing either wet etch or dry etching techniques. The example embodiment of FIG. 6C illustrates that the alignment of patterning mask 106 to the already-patterned features defined by mask 103 can have a degree of misalignment tolerances (in this example about smaller than +/−(g/2) as described above). In this schematic cross-sectional view it becomes clear that even if the patterning mask 106 was not perfectly aligned, hence misaligned within +/−(g/2), the buried inner bi-material regions as shown with indication 15 in FIG. 6E would remain unaffected by such misalignment. FIG. 6E illustrates a cross-section view after the etching process and after the resist removal, indicating the finalization of the frontside-patterning of the first step 901 of the overall microfabrication process 900.

Figure 7:
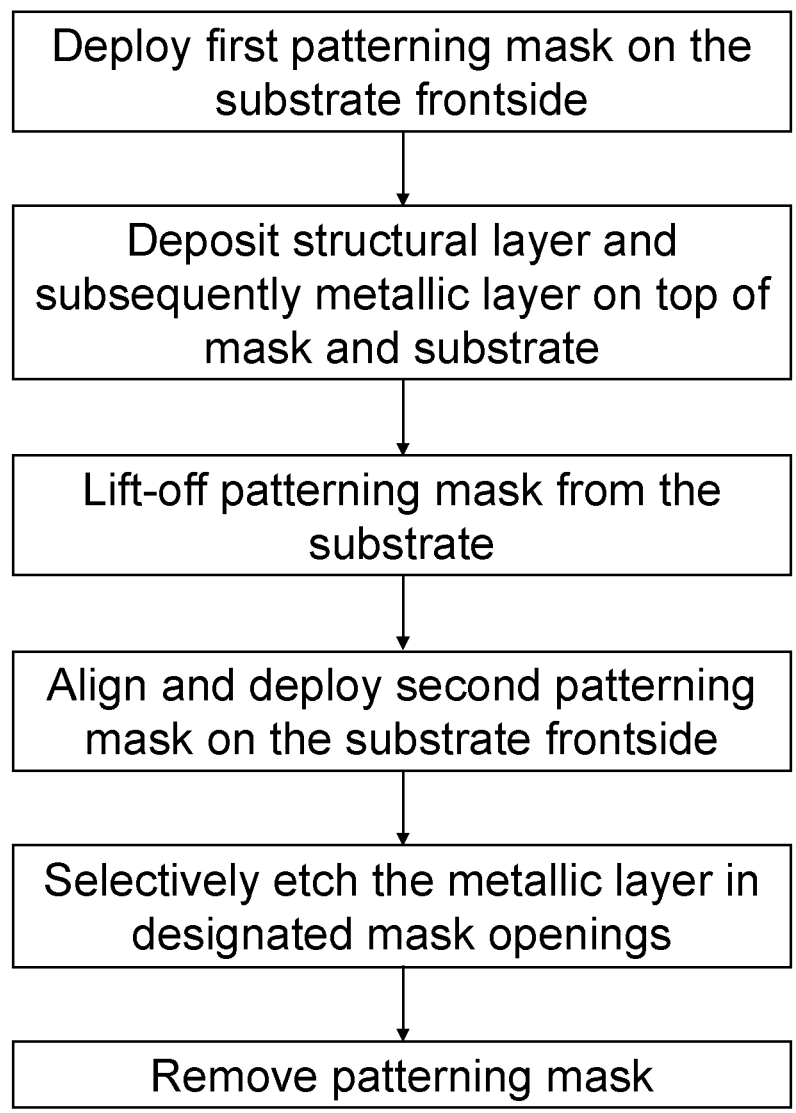
FIG. 7 is a flow diagram summarizing the method disclosed in FIGS. 6A to 6E.

Referring now to FIG. 7, a process diagram summarizes process flow 100 including the self-alignment method utilizing a lift-off technique to initially pattern both layers.

Referring now to FIGS. 8A to 8F, an alternative schematic method of a microfabrication process flow 200 is disclosed. Microfabrication process flow 200 is similar to the above described process flow 100, however it does not utilize a lift-off technique.

FIG. 8A is schematic cross-sectional view of a substrate 102 with the structural layer 104 and metallic layer 105 deposited on top of each other. In some embodiments, the structural layer can be deposited on both sides of the substrate when using, for example, thermal deposition methods. In some embodiments the substrate can be structured prior to any deposition of a layer. In some embodiments one or a multiplicity of layers can be deposited prior the structural layer deposition, which can function as etch stop layers, absorption layers, and the like. The metallic layer 105 can be deposited using standard evaporation or sputtering techniques. In some embodiments an adhesion layer can be deployed prior to the metallic thin film deposition. Schematically, only the two base layers are shown in all herein presented embodiments.

FIG. 8B is a schematic cross-sectional view of a substrate 102 including layer 104 and 105 with a patterning mask 103a on top of the layers. The patterning mask 103a is an inverse pattern to the mask 103 described in FIG. 6A. The mask 103a can be of the same feature as the mask 4 in FIG. 4. The patterning mask 103a is meant to define the shape of the structural layer, but in the first patterning step both layers are patterned with this mask, according to the "self-alignment" method.

FIG. 8C shows schematically the etching/patterning of both layers 104 and 105 through an etch process with the patterning mask 103a on top. In some embodiments, the etching process of both, or of all layers can be performed in one reaction chamber. One example could include reactive ion etching (RIE), where aluminum can be selectively etched using chlorine and the remaining silicon oxide dielectric layer can be selectively removed using fluorine etch agents. Alternative etch stop layers (which are meant to be an etch stop for the back side deep silicon etch release) can be patterned through strong physical etching in the same chamber in one process run.

FIG. 8D shows a schematic cross-sectional view of a substrate 102 with a second patterning mask 106 onto the patterned layers 104 and 105. FIGS. 8D-8F describe same features, characteristics and methods as described above in FIGS. 6C-6E, respectively. The process flow 200 includes the self-aligning technique to ensure exact overlay of critical bi-material features, such as exemplarily indicated at feature 15.

Figure 9:
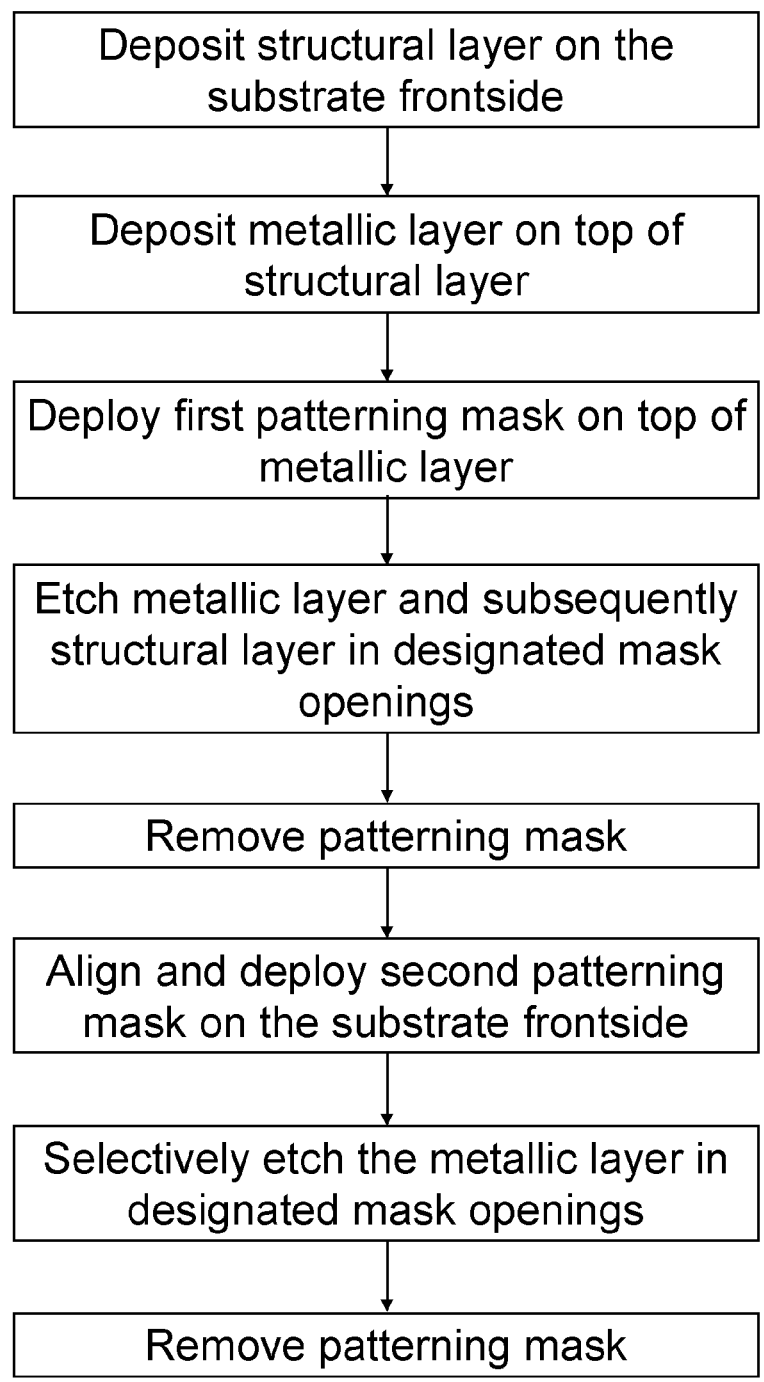
FIG. 9 is a flow diagram summarizing the method disclosed in FIGS. 8A to 8F.

Referring now to FIG. 9, a process diagram summarizes process flow 200 including the self-alignment method without utilizing a lift-off technique to initially pattern both layers.

The second part 902 of the overall microfabrication process 900 follows the frontside patterning 901. The second part 902 is the backside substrate-through etch release of the devices 1 on the frontside. The mask for the substrate patterning openings is deployed on the wafer (e.g., a semiconductor wafer) backside. In one embodiment, the etch process to release the frontside geometries is performed utilizing deep reactive ion etching (DRIE). In this process the substrate is turned around (flipped over), positioned on its frontside and the backside is exposed to the etch agent (plasma).

In some embodiments a so-called bottom surface cooling is applied to the substrate in the reaction chamber to prevent the etch agent from overheating the exposed patterning mask. The bottom surface cooling technique can apply pressure to the contact substrate and is advantageous for the procedural step. However, it can add mechanical stress to the substrate. Since the bottom surface is in such case the initial substrate frontside with its microscopic and fine features, the disclosed method protects these frontside features from physical contact and eventually from cooling-pressure induced physical stress.

Another aspect of present disclosure is a method to protect the frontside features during the release step with a cavity carrier substrate.

In one embodiment, the cavity carrier substrate can be temporarily or permanently attached/fixed onto the substrate's 102 frontside. The cavity carrier substrate can be of about the same size as the substrate 102 and further is designed, aligned and overlaid in such fashion that its contact surface does not come in contact with the frontside devices 1 on substrate 102. The cavity carrier substrate protects the devices 1 with its designated cavities.

In some embodiments, the carrier substrate can be made out of more than one unit and can be a stack of two or multiple carrier substrates in order to form a cavity protection for the frontside features on substrate 102.

In some embodiments, a cavity carrier substrate can be made out of glass or fused silica and can be visually transparent. A transparent cavity carrier substrate can form "caps" over the frontside features. For frontside optical readout of the radiation induced thermo-mechanical displacements, the cavity cap needs to be visually transparent, or transparent for the readout light. Also the visually transparent cavity substrate can be coated with visually anti-reflective, optical, protective, structured bonding or other layers.

In some embodiments, a transparent cavity carrier substrate can be permanently attached to the frontside of the substrate 102. Such permanent attachment can be realized through bonding and further can include hermetic sealing of the devices 1 in the transparent cavities.

In some embodiments, prior to the frontside attachment of a cavity wafer, other layers, different than the two basic layers, can be implemented on the frontside. Layers for absorption, conductivity enhancement, getter and/or bonding can be deposited and structured on the substrate's 102 frontside.

Figure 10:
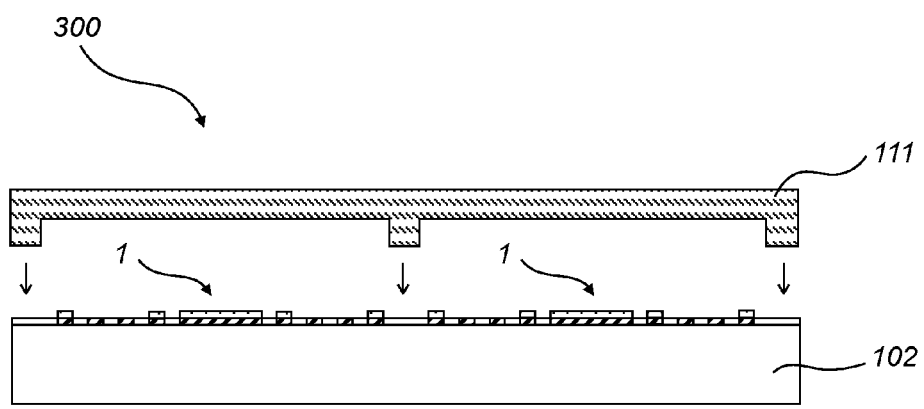
FIG. 10 discloses a schematic example method of the frontside protection and encapsulation of advanced micro-thermo-mechanical devices.

Referring now to FIG. 10, a schematic layout of a method 300 is disclosed where a cavity carrier substrate 111 is attached on the substrate's 102 frontside. The cavity substrate 111 includes cavities that were previously etched into the substrate (not shown), and are designated to form a cap over the devices 1 on the substrate 102 frontside. Further, the cavity substrate 111 can be of visually transparent material such as glass or fused silica. The attachment of the two substrates can be realized via bonding, for example, anodic bonding, which can further seal the contact surfaces hermetically. Other attachment (bonding) techniques can include unstructured or structured layers between the two contact surfaces (e.g., oil, wax or glue for temporary or permanent non-hermetic attachment, or an intermediate metal layer for eutectic bonding). With this method, the manipulation of the substrate 102 is less critical and the frontside features are protected from physical contact. With a bonded glass cap substrate 111, the substrate 102 can be turned around and positioned on its frontside for the backside etch process. Further, the bonding of both substrates can be performed on a wafer-to-wafer level. This means, for simplicity purposes, two wafer substrates of about equal diameter are aligned over each other and bonded with each other. In one embodiment, off-the-shelf substrates can be utilized for reducing the overall manufacturing expense.

Figure 11:
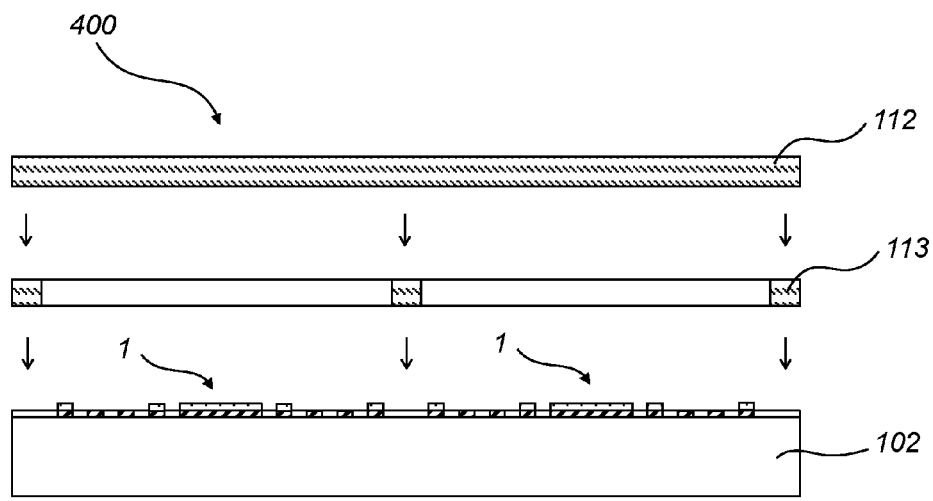
FIG. 11 discloses another schematic example method of the frontside protection and encapsulation of advanced micro-thermo-mechanical devices.

In some embodiments the requirements for the cavity geometries of a cavity substrate 111 can be challenging in terms of cavity depth or etch duration with very toxic and corrosive etch agents such as hydrofluoric acid for glass etching. A new method 400 is disclosed in FIG. 11 where a cavity carrier substrate can contain two parts, a cap substrate 112 and a perforated substrate 113, which are attached on the substrate 102 frontside. Such method is schematically shown in FIG. 11 as a cross-section and in FIG. 12 as a 3D model.

Figure 12:
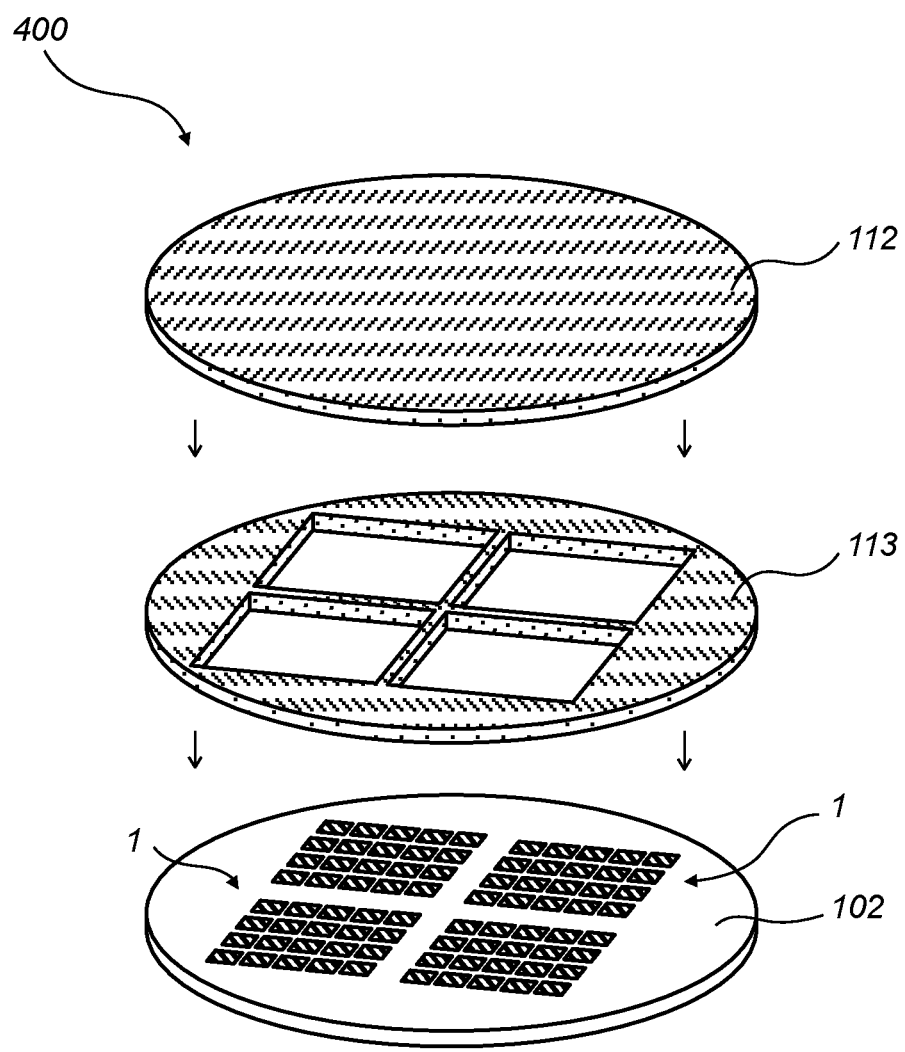
FIG. 12 is a schematic three-dimensional (3D) view of the method illustrated in FIG. 11.

FIG. 12 shows schematically for one embodiment a wafer-to-wafer level attachment of method 400 where two carrier wafers are attached to the substrate's 102 front side to form protective caps for features 1. While the top carrier substrate 112 can be an off-the-shelf transparent glass wafer substrate, the perforated substrate 113 can be, but does not have to be visually transparent and can be off-the-shelf as well. It can be of the same material, such as silicon for the substrate 102. The perforation can be either etched inside the substrate 113, or it can be removed via, for example, laser cutting (laser drilling or laser trepanning). For silicon-through etching, the standard wet-etch agent potassium hydroxide can be used which is less toxic than hydrofluoric acid for glass etching, further simplifying the overall process in terms of handling ease and accessibility.

After the frontside feature protection by a cavity carrier substrate using method 300 or 400, the second part 902 can be continued with backside etch release of the frontside features.

Figure 13A:
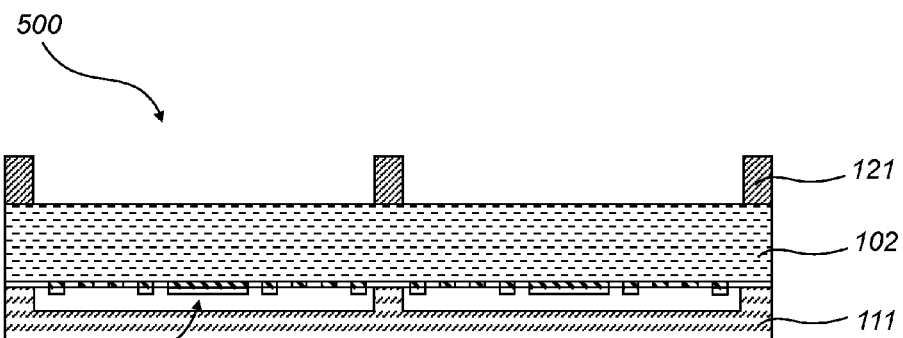
FIGS. 13A to 13C disclose a schematic example process flow method of the backside release in order to produce advanced micro-thermo-mechanical devices.
Figure 13B:
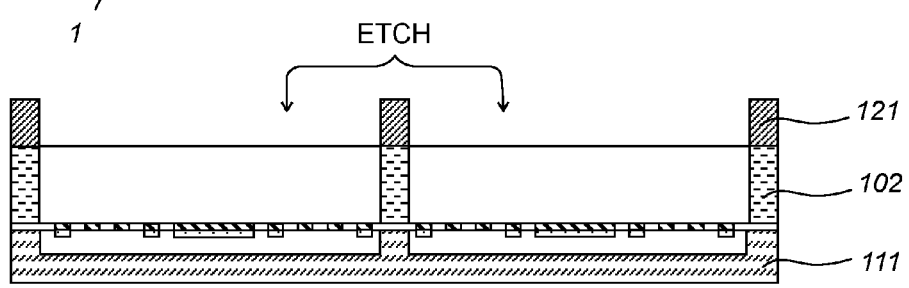
Figure 13C:
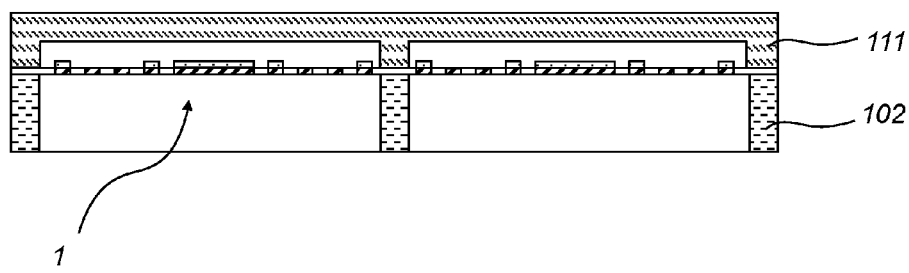

Referring now to FIGS. 13A to 13C, a schematic method 500 in one embodiment of a microfabrication process flow is disclosed for the backside substrate-through etch release. In these example embodiments a cavity carrier substrate 111 is utilized to protect the devices 1 on the frontside of substrate 102. In FIGS. 13A and 13B the substrate 102 with a frontside cap substrate 111 attached is shown a "flipped around" state, as how it would be placed into a typical DRIE reaction chamber with its backside facing up towards the etch agent (plasma).

FIG. 13A shows schematically a cross-sectional view of a "flipped around" substrate 102 with a patterning mask 121 on its backside and with an attached cavity protection substrate 111 on its frontside. The cavity openings as well as the mask patterns are aligned with the designated devices 1.

FIG. 13B shows schematically the partial removal of the substrate 102 through a anisotropic dry etch. Such dry etch can be performed with deep reactive ion etching (DRIE) of silicon. Here the substrate 102 is completely etched through in order to release the devices 1 on the frontside. The devices 1 are anchored on the sideway substrate rails and their main body parts are free-standing in air as displayed in example embodiment device 1 of FIG. 2.

FIG. 13C shows schematically the stage after the backside release of the devices 1 without the patterning mask 121—and its upright position (not flipped around). The removal of a standard polymer photoresist patterning mask can be performed through dry etch with oxide plasma, and can be performed, for example, in the same reaction chamber after the silicon dry etching.

In some embodiments the etch-rate (ER) of silicon in the backside etch release via DRIE can depend on many factors. Generally, the input etch-parameters dictate the overall etch-performance and the resulting ER of the exposed materials. Among others, the ER can depend on 1) the spatial extent (it can have in particular a radial dependency where the ER can be higher in the center than on the substrate edges), 2) the etch duration, where the ER can decrease and in particular the ER (radial) non-uniformity can increase on the overall processing time, and 3) the etch load, where the etch areas (etch windows) and their density can dictate its ER and in some embodiments larger etch windows can have a higher ER than smaller etch windows.

In the discussion below, embodiments for four different methods are disclosed to achieve a high yield for silicon backside through etch release of advanced micro-thermo-mechanical devices 1 via DRIE. A high yield implies that the majority of the advanced micro-thermo-mechanical devices 1 are released substantially uniformly and substantially simultaneously or within a small period of time.

A substantially simultaneous release across the entire substrate will enable the devices 1 to be exposed about the same time to the DRIE etch agent. The exposure of the DRIE etch agent to the dielectric substrate layer can result in an etching of the dielectric layer and hence alter its geometrical and mechanical properties, and therefore is preferably kept to a minimum. Dielectrics, and in particular silicon oxides can have a higher etch resistivity to typical DRIE silicon etch agents. However, the dielectrics do get etched, although at a much slower ER than the silicon substrate. A lateral non-uniform exposure of the DRIE etch agent to the devices 1 is preferably minimized or avoided for achieving high lateral release uniformity of devices 1 and therefore a high yield.

Referring now to FIGS. 14A to 14C, schematic cross-section examples of a substrate 102 are shown in a timely manner of the DRIE process that has a process-time-dependent radial non-uniform etch rate as can occur in some embodiments. FIG. 14A shows a substrate 102 with a backside mask 121 before the DRIE process. The mask 121 has etch openings (etch windows) periodically and of the same size across the substrate. The center etch window is of equivalent width $w_0$ as the etch window width $w_r$ towards the outer region of the radius, hence $w_0=w_r$. This example embodiment schematically shows a large diameter substrate to emphasize a large-scale manufacturing procedure (e.g., 200 mm or larger diameter silicon wafer substrates).

FIG. 14B is a schematic cross-section of substrate 102 in a moment after the DRIE process starts. The ER can be uniform across the entire wafer substrate some few minutes after the process starts.

FIG. 14C shows a moment of a progressed DRIE step with the first frontside features already through-etch released in the center, but not yet through-etch released features away from the center. The ER non-uniformity in this example has a radial dependency where the center of the substrate has a higher ER than the outer regions. The radial ER profile is indicated schematically with the dashed line 501, with the arrow sizes representing schematically the ER magnitude. The DRIE ER non-uniformity can be caused by procedural features and can be dependent on process parameters and the process time. If the process would continue until the outside devices are finally released, then the center devices would get exposed to the etch agent during that processing time and would be slowly etched. This could result in a non-uniformity of the devices 1 and therefore a low manufacturing yield.

Figure 15:
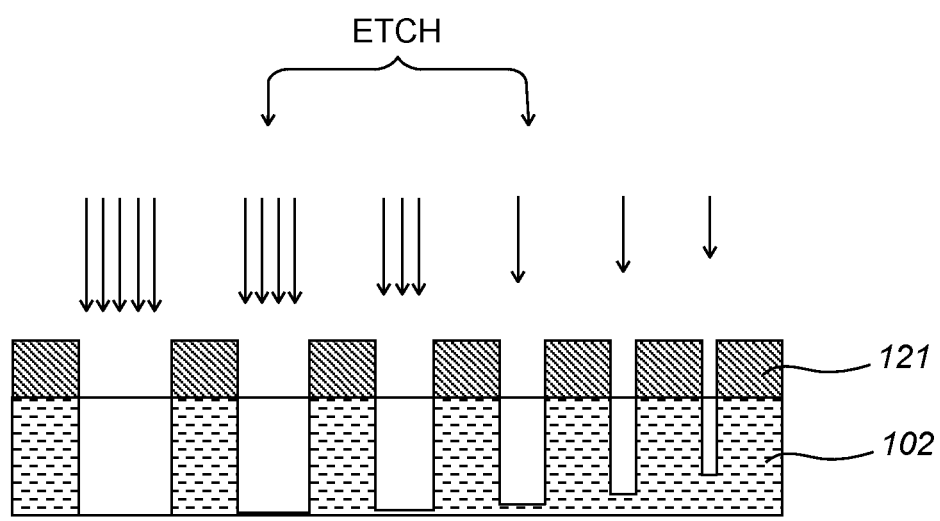
FIG. 15 shows a schematic example of the backside release including another type of disadvantageous non-uniform etch profile as can occur in some embodiments.

Referring now to FIG. 15, a schematic cross-section example of a substrate 102 is shown at a moment in time of a DRIE process that has a non-uniform etch rate, depending on the "etch-load" as can occur in some embodiments. In some embodiments larger mask windows can have a higher ER than smaller mask windows within the same process. The arrow sizes represent schematically the ER magnitude.

Referring now to FIGS. 16A to 16C, in one embodiment schematic cross-section examples of a substrate 102 are shown in a timely manner of the DRIE process implementing the method 600 of a microfabrication procedure that can lead to a substantially simultaneous through-etch of the entire silicon wafer substrate at the DRIE process. As explained in the example embodiments of FIGS. 14 and 15, the DRIE etch rate can have a radial and etch-load dependency. The method 600 includes the lateral variations of the etch windows in order to compensate the radial ER non-uniformity and in order to achieve an about constant ER across the entire wafer substrate. The center etch window $w_0$ is of smaller width than the etch window $w_r$ towards the end of the radius, hence $w_0<w_r$ to compensate the radial non-uniform etch-profile. The uniform ER profile is indicated schematically with the dashed line 601.

If the backside etch windows are bound to small tolerances and cannot be increased or decreased to such an amount to adjust the designated ER due to area/space constraints because of a high arrangement density of frontside features 1, then, if space allows, additional (dummy or "blind") etch openings can be implemented besides these designated etch windows. In some embodiments, increasing the etch-window area density can have a positive or negative effect on the DRIE ER. Hence, additional etch openings can be implemented into the backside patterning mask to compensate for the spatial etch profile non-uniformity. Such additional etch windows would not be meant to release any frontside features, but act primarily as a local etch-load addition.

The radial ER non-uniformity in the example above is only one specific example and such method of adjusting the local etch load in order to compensate local ER non-uniformities can be applied to other ER non-uniformity (non-radial) profiles.

Referring now to FIGS. 17A to 17C, in one embodiment schematic cross-section examples of a substrate 102 are shown in a timely manner of a substrate removal and the DRIE process implementing the method 610 of a microfabrication procedure that can lead to a substantially simultaneous through-etch of the entire silicon wafer substrate at the DRIE process. This method 610 provides a "pre-etch" or substrate removal step, indicated schematically with "ETCH 1" in FIG. 17B prior to the actual DRIE (referred to as "ETCH 2") process. The pre-etch can be performed using substrate wet-etch, or laser removal of the substrate or a combination of both. Further, the etch windows on mask 121 can be of the same width and periodicity. The ETCH 1 step of this method 610 includes a substantial local substrate removal prior to the DRIE process, so the final DRIE process can be performed in a relatively short time in order to release the substrate's 102 frontside features.

Despite a time and/or spatially-dependent DRIE ER, the frontside features can be released substantially simultaneously if the remaining substrate is relatively thin and the remaining DRIE release process is relatively short. Hence, a non-uniform release can be avoided. In some embodiment the ETCH 1 step does not require a patterning mask. The entire substrate can be thinned through a uniform silicon substrate wet etch. In some embodiments laser drilling or partial (local) substrate removal through laser intervention can be used to remove a substantial amount of the designated substrate openings. In some embodiments, where a pre-removal in the designated areas is performed via laser drilling or laser intervention, no patterning mask might be needed for the final DRIE process if the remaining to-be-removed substrate thickness is relatively thin compared to the total supporting substrate thickness. Upon the pre-removal of the substrate in the designated areas, a relatively short DRIE process is performed to fully release the devices 1 on the front side as indicated in FIG. 17C schematically with "ETCH 2". In some embodiments, a combination of wet-etch and dry-etch/removal can be applied for the ETCH 1 step.

Referring now to FIGS. 18A to 18C, in one embodiment schematic cross-section examples of a substrate 102 are shown in a timely manner of a DRIE process with a non-uniform ER, implementing the method 620 of a microfabrication procedure that can lead to a high yield of the released devices 1 on substrate 102 through implementing an etch barrier layer 604 between the structural layer of device 1 and its substrate 102. An etch barrier layer 604 can be, but is not limited to, a thin $Al_2O_3$ layer, deposited prior to the structural layer deposition. The etch barrier layer 604 is then structured with the first patterning mask in the same process of structuring the structural layer. Hence, the etch barrier layer 604 covers the device's 1 entire bottom side of the structural layer surface. Further, the etch barrier layer 604 is thinner than the structural layer in order to not substantially inhibit the bi-material actuation. Further, the etch barrier layer 604 has low reflectivity for the designated detection radiation bandwidth, in order to not block the incident irradiation flux. The devices 1 including an etch-barrier layer 604 can be relatively insensitive to a degree of a non-uniform DRIE etch-profile, as indicated with the dashed line 501 in FIGS. 18B and 18C (equivalent to FIG. 14C). The method 620 includes the embodiment of an etch barrier layer 604 beneath the device 1, so the device 1 can withstand longer exposures to the DRIE etch agents upon release.

Referring now to FIG. 19A to 19H, in one embodiment schematic cross-section examples are shown in a process flow implementing the method 630 of a microfabrication procedure that can lead to a substantially simultaneous through-etch of the entire silicon wafer substrate at the DRIE process through implementing a relatively very thin substrate 102a. For microfabrication processes, substrates require a certain thickness in order to ease their overall handling procedures and prevent them from cracking or breaking upon handling. Method 630 includes a bottom-mounted carrier substrate 631 for the very thin substrate 102a in order to ease the overall handling efforts for its first sub-process, the frontside structuring, which is shown schematically in FIGS. 19A to 19C.

The bottom-mounted carrier substrate 631 can be attached temporarily to the substrate 102a, as shown in FIG. 19B, and can then be detached after the frontside cavity substrate 111 has been attached to the very thin substrate 102a as indicated in FIGS. 19D and 19E. After the bottom-mounted carrier substrate 631 removal (FIG. 19E), the backside mask 121 can be deployed to the substrate 102a for the backside DRIE release process, as shown in FIG. 19F.

FIG. 19G shows schematically the backside DRIE process. The very thin substrate 102a can be etched-through relatively rapidly. Hence, a non-uniform DRIE etch-profile can have little impact on the non-uniform release of the features 1 on the very thin substrate's 102a frontside because of the two same reasons as for the above-described methods: 1) the ER non-uniformity can be sometimes smaller at the beginning of the DRIE process and increase over time, and 2) despite some degree of a non-uniform etch-profile, the overall etch duration can be relatively short, and therefore first-released features 1 will not get exposed excessively long to the DRIE etch agent until the last feature is released. FIG. 19H shows the very thin substrate 102a after the mask 121 removal, which can be performed (as described above at FIG. 13C) with standard oxygen-based dry-etch removal.

In some embodiments of the method 630 the patterning mask for the backside release of the very thin substrate 102a can be a "hard mask", including the same patterning as mask 121. A hard mask can be a silicon substrate and can be temporarily attached on the very thin substrate's 102a backside in order to provide enhanced mechanical protection for it during the DRIE process.

In some embodiments the bottom-mounted carrier substrate can include designated fixation points to fix the very thin substrate 102a against displacements or rotation. For this purpose the very thin substrate 102a can include designated indentation, such as, for example a three-point indentation fixture.

In some embodiments a combination of multiple methods disclosed herein can be applied to realize a substantially uniform and a substantially simultaneous release of the frontside features.

Within the herein disclosed simplified microfabrication method 900 for fabricating advanced micro-thermo-mechanical devices, after the second sub-process 902, the backside substrate through-etch to release the devices, the third sub-process 903, the encapsulation of the devices in an operational atmosphere for performance improvements follows. In one embodiment, encapsulating the advanced micro-thermo-mechanical devices into an operational atmosphere, such as reduced atmospheric pressure (<40 mTorr) or specific gases of low thermal conductivity, such as inert gases, can increase the overall sensitivity and responsivity of the advanced micro-thermo-mechanical device 1. The encapsulation in operational atmosphere is performed as one of the final steps of the overall microfabrication process.

In some embodiments the encapsulation or sealing can be performed on a "wafer-level" scale, where a matching bottom cap substrate is attached (bonded) onto the substrate 102 from the bottom side under the designated operational atmosphere, and hence hermetically seals the cavities and through-etched channels of the devices 1.

Figure 20A:
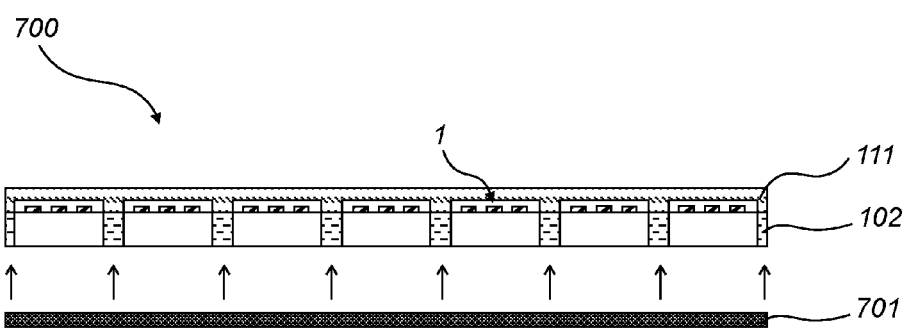
FIGS. 20A to 20C disclose a schematic example process flow method of encapsulating advanced micro-thermo-mechanical devices.
Figure 20B:
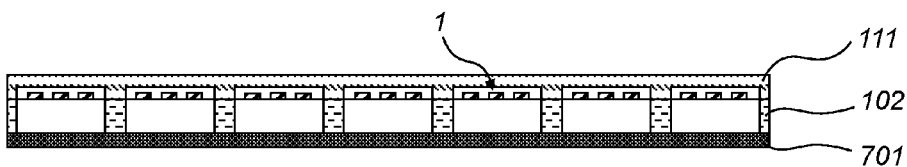
Figure 20C:
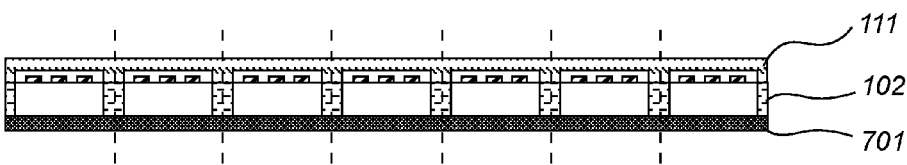

Referring now to FIGS. 20A to 20C, in one embodiment a schematic method 700 of a microfabrication procedure is disclosed for encapsulating devices 1 in operational atmosphere. As shown in FIG. 20A, the method 700 includes the attachment of a sealing substrate 701 on the bottom side of the substrate 102, which already includes an attached frontside cavity substrate 111 and has undergone the though-etch release process. The sealing substrate 701 can be of a material, for example, that is transparent for the designated bandwidth or wavelength of detection. In some embodiments such material can include silicon or germanium. Further, the substrate 701 and substrate 102 including frontside substrate 111 can be of the same size for a "wafer-level" attachment/bonding/packaging. The sealing substrate 701 can be double-side polished and can include a single or double-side coated anti-reflective optical layer, or additional optical layers or filters for the designated wavelength or bandwidth of detection. Further, it can include structured layers such as, for example, intermediate layers for various bonding techniques or structured getter layers, and the like. Further, it can include other layers such as protective layers.

FIG. 20B shows schematically in one embodiment a ready-sealed substrate stack with the devices 1 being encapsulated in operational atmosphere. FIG. 20C shows schematically the dicing lines from a cross-section perspective as the dashed lines. The final sensor chips including the encapsulated devices 1 can be, for example, square or rectangular and the dicing lines can run perpendicular to each other in order to release the structures. The dicing step is the final step and fourth part 904 of the herein disclosed simplified microfabrication method 900 for fabricating advanced micro-thermo-mechanical devices. The sensor chips including the encapsulated devices 1 are ready for use in a radiation sensing detector, which operates with back-irradiated thermo-mechanical radiation micro-sensor and includes a frontside optical readout.

In some embodiments, prior to the backside attachment of a sealing substrate 701, absorption, conductivity, getter or intermediate bond layers may be deployed onto to substrate's 102 backside.

Figure 21:
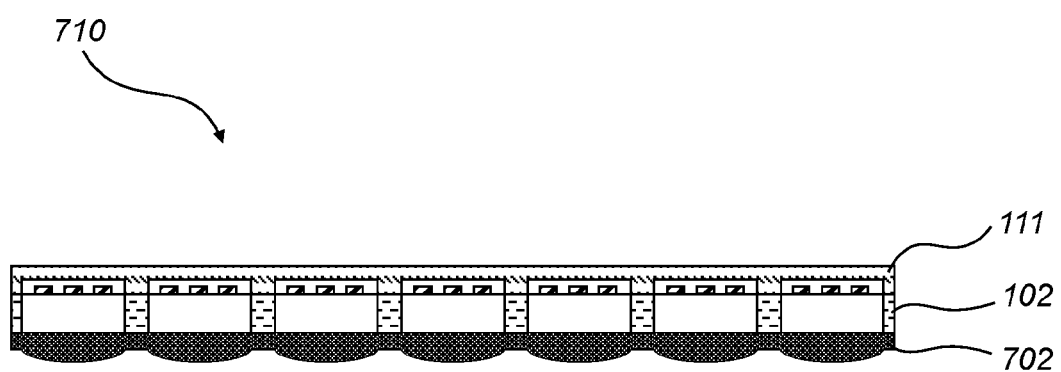
FIG. 21 discloses a schematic example process flow method of encapsulating advanced micro-thermo-mechanical devices with a structured substrate that can form an optical element.

Referring now to FIG. 21, in one embodiment a schematic method 710 of a microfabrication procedure is disclosed for encapsulating devices 1 in operational atmosphere with a structured sealing substrate. A structured sealing substrate as shown schematically as 702 in FIG. 21 can include a shape in such matter that it forms an optical element, focusing incident radiation flux onto the focal plane array of the devices 1 and therefore form an imaging lens for those devices.

In some embodiments the structured sealing substrate can be a material of silicon or germanium, including a high refractive index, making these materials ideal for radiation optical elements. The example embodiments are only for schematic purposes and the structuring of the sealing substrate as included in the method 710 can be on both sides. In some embodiments the structuring side can face the substrate's 102 backside, and not be facing away such as shown in these example embodiments. In some embodiments an imaging element of a single sphere can be used for one focal plane array of devices 1 (on one sensor chip/die) such as schematically shown in FIG. 21.

Various further non-limiting embodiments are now described below. In a first embodiment, a microfabrication process is used for producing a micro-thermo-mechanical device (e.g., as illustrated in FIG. 2), the device including a frontside structuring part, a backside etch release part of the frontside structuring part, and an encapsulating part of the released frontside structure on a wafer-level.

In one embodiment, the method self-aligns the frontside structuring part when depositing the structural and metallic layer.

In one embodiment, the method protects the frontside structure for the backside etch release by attaching a cavity substrate prior to the release step, using a cavity substrate consisting of either one element, or a cavity substrate consisting of two elements, where one element is perforated and the other element has unstructured surfaces.

In one embodiment, the method increases uniformity of the backside etch release through deep silicon dry etching by the variation of local etch loads through size variation of the etch patterns and/or implementing additional etch patterns to increase the local etch load in order to achieve a uniform ER across the entire substrate.

In one embodiment, the method increases uniformity of the backside etch release through deep silicon dry etching by partial substrate pre-removal with one or a multiplicity of techniques other than deep silicon dry etching.

In one embodiment, the method increases uniformity of the backside etch release through deep silicon dry etching by implementing an etch barrier layer that is more resistant to the DRIE than the actual structural layer, and such layer is covering the structural layers backside.

In one embodiment, the method increases uniformity of the backside etch release through deep silicon dry etching by utilizing a thin wafer, that is being fixed for the previous processing by a carrier wafer.

In one embodiment, the method hermetically seals the free-standing frontside feature with a visually transparent cavity substrate on the frontside (this is done after the step of protecting the frontside structures by attaching the cavity substrate mentioned above) and a radiation transparent substrate on the backside under operational atmosphere (using a lower pressure and/or a defined gas). In one embodiment, optical elements are integrated on the backside sealing substrate.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

The invention claimed is:

1. A method, comprising:
  patterning, using a first mask, at least one layer and a structural layer overlying a frontside of a substrate, wherein the at least one layer comprises a metallic layer, and the at least one layer is overlying the structural layer;
  removing the first mask;
  forming a second mask overlying the substrate, the second mask comprising mask openings;
  selectively patterning the at least one layer using the mask openings;
  removing the second mask; and
  releasing a first device by etching a backside of the substrate, wherein the first device is one of a plurality of devices on the substrate, and wherein the first device comprises a plate comprising an absorber area and a reflector area, and the first device further comprises legs attached to the plate, the legs comprising at least a portion of the metallic layer.

2. The method of claim 1, wherein the substrate is a semiconductor wafer, the method further comprising sealing each of the plurality of devices, the sealing comprising attaching a transparent cavity cap to the frontside of the wafer.

3. The method of claim 2, wherein the sealing further comprises attaching a radiation-transparent substrate to the backside of the wafer.

4. The method of claim 3, further comprising dicing the wafer to provide a plurality of sensor chips, each sensor chip comprising one of the plurality of devices.

5. The method of claim 1, wherein the etching is reactive ion etching.

6. The method of claim 1, further comprising structuring the substrate prior to forming the structural layer and prior to forming the metallic layer.

7. The method of claim 6, wherein the structuring of the substrate comprises etching the substrate.

8. The method of claim 1, further comprising forming an adhesion layer on the structural layer prior to forming the metallic layer, wherein the metallic layer is formed on the adhesion layer.

9. The method of claim 1, further comprising, prior to forming the structural layer, etching the backside of the substrate.

10. A method, comprising:
- patterning, using a first mask, at least a metallic layer and a structural layer, wherein the metallic layer is overlying the structural layer, and the structural layer is overlying a frontside of a substrate;
- selectively patterning at least the metallic layer using mask openings of a second mask; and
- releasing a first device by etching a backside of the substrate, wherein the first device is one of a plurality of devices on the substrate, and wherein the first device comprises a plate and legs attached to the plate, the legs comprising at least a portion of the metallic layer.

11. The method of claim 10, wherein the plate comprises an absorber area and a reflector area.

12. A method, comprising:
- selectively patterning, using at least one first mask, at least one layer, wherein the at least one layer comprises a metallic layer, the at least one layer is overlying a structural layer, and the structural layer is overlying a frontside of a substrate;
- removing the at least one first mask;
- patterning, by forming a second mask overlying the substrate, the at least one layer and the structural layer, wherein the second mask comprises mask openings used for the patterning;
- removing the second mask; and
- releasing a first device by etching a backside of the substrate, wherein the first device is one of a plurality of devices on the substrate, and wherein the first device comprises a plate comprising an absorber area and a reflector area, and the first device further comprises legs attached to the plate, the legs comprising at least a portion of the metallic layer.

13. The method of claim 12, further comprising sealing each of the plurality of devices, the sealing comprising attaching a transparent cavity cap to the frontside of the substrate, and wherein the sealing further comprises attaching a radiation-transparent substrate to the backside of the substrate.

* * * * *